(12) United States Patent
Niu et al.

(10) Patent No.: US 11,839,018 B2
(45) Date of Patent: Dec. 5, 2023

(54) FLEXIBLE PRINTED CIRCUIT BOARD AND DISPLAY TOUCH APPARATUS

(71) Applicants: Chengdu BOE Optoelectronics Technology Co., Ltd., Sichuan (CN); BOE Technology Group Co., Ltd., Beijing (CN)

(72) Inventors: Wenxiao Niu, Beijing (CN); Xinpeng Wang, Beijing (CN); Hengzhen Liang, Beijing (CN); Xiaolong Zhu, Beijing (CN); Lianbin Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 213 days.

(21) Appl. No.: 17/427,110

(22) PCT Filed: Dec. 17, 2020

(86) PCT No.: PCT/CN2020/137092
§ 371 (c)(1),
(2) Date: Jul. 30, 2021

(87) PCT Pub. No.: WO2022/126467
PCT Pub. Date: Jun. 23, 2022

(65) Prior Publication Data
US 2022/0408548 A1 Dec. 22, 2022

(51) Int. Cl.
*H05K 1/18* (2006.01)
*H05K 1/02* (2006.01)
(Continued)

(52) U.S. Cl.
CPC ....... *H05K 1/0218* (2013.01); *G06F 3/04164* (2019.05); *H05K 1/0281* (2013.01);
(Continued)

(58) Field of Classification Search
CPC .... H05K 1/0218; H05K 1/0281; H05K 1/189; H05K 2201/0715; H05K 2201/09027;
(Continued)

(56) References Cited

U.S. PATENT DOCUMENTS

| | | | |
|---|---|---|---|
| 2012/0249458 A1* | 10/2012 | Okazaki | G06F 3/0446 345/173 |
| 2015/0288088 A1 | 10/2015 | Kwon et al. | |
| 2021/0125913 A1* | 4/2021 | Kim | H05K 3/323 |

FOREIGN PATENT DOCUMENTS

| | | |
|---|---|---|
| CN | 109144320 A | 1/2019 |
| CN | 109634003 A | 4/2019 |

(Continued)

*Primary Examiner* — Binh B Tran
(74) *Attorney, Agent, or Firm* — Ling Wu; Stephen Yang; Ling and Yang Intellectual Property

(57) ABSTRACT

A flexible printed circuit board and a display touch apparatus are provided. The flexible printed circuit board includes a binding terminal region, a first circuit region and a second circuit region; the binding terminal region includes multiple terminals, the first circuit region includes a driver circuit, multiple first signal lines, multiple second signal lines, and multiple third signal lines, and the second circuit region includes an external connector; first ends of the multiple first signal lines, the multiple second signal lines and the multiple third signal lines are respectively connected to the terminals of the binding terminal region; second ends of the multiple first signal lines and the multiple second signal lines are respectively connected to the driver circuit; and second ends of the multiple third signal lines are connected to the connector.

19 Claims, 7 Drawing Sheets

(51) Int. Cl.
*G06F 3/041* (2006.01)
*G06F 3/044* (2006.01)
*H10K 59/40* (2023.01)
*H10K 59/131* (2023.01)

(52) U.S. Cl.
CPC ........... *H05K 1/189* (2013.01); *G06F 3/0412* (2013.01); *G06F 3/0446* (2019.05); *H05K 2201/0715* (2013.01); *H05K 2201/09027* (2013.01); *H05K 2201/09036* (2013.01); *H05K 2201/09227* (2013.01); *H05K 2201/09245* (2013.01); *H05K 2201/09509* (2013.01); *H05K 2201/10128* (2013.01); *H05K 2201/10189* (2013.01); *H05K 2201/2009* (2013.01); *H10K 59/131* (2023.02); *H10K 59/40* (2023.02)

(58) Field of Classification Search
CPC .......... H05K 2201/09036; H05K 2201/09227; H05K 2201/09245; H05K 2201/09509; H05K 2201/10189; H05K 2201/2009; G06F 3/04164; G06F 3/0446; G06F 3/0412; H10K 59/131; H10K 59/40
USPC .......................................................... 361/749
See application file for complete search history.

(56) References Cited

FOREIGN PATENT DOCUMENTS

| | | |
|---|---|---|
| CN | 209199078 U | 8/2019 |
| CN | 111261055 A | 6/2020 |
| CN | 211044880 U | 7/2020 |
| CN | 112035013 A | 12/2020 |

* cited by examiner

FLEXIBLE PRINTED CIRCUIT BOARD AND DISPLAY TOUCH APPARATUS

CROSS-REFERENCE TO RELATED APPLICATION

The present disclosure is a U.S. National Phase Entry of International Application PCT/CN2020/137092 having an international filing date of Dec. 17, 2020, and the contents disclosed in the above-mentioned application are hereby incorporated as a part of this application.

TECHNICAL FIELD

The present disclosure relates to, but is not limited to, the field of display technology, in particular to a flexible printed circuit board and a display touch apparatus.

BACKGROUND

With rapid development of display technology, touch screens have gradually spread throughout people's lives. According to a composition structure, touch screen panels may be classified as types of Add on Mode, On Cell Mode, In Cell Mode, etc. According to working principles, touch screens may be divided into capacitive touch screen, resistive touch screen, infrared touch screen, surface acoustic wave touch screen, etc. Capacitive On Cell type is a touch structure formed on a light exit surface of a display screen, and the Capacitive On Cell type has gradually became a mainstream technology due to advantages such as simple structure, small thickness, high transmittance, etc.

SUMMARY

The following is a summary of subject matter described in detail herein. This summary is not intended to limit the protection scope of the claims.

An exemplary embodiment of the present disclosure provides a flexible printed circuit board, including a binding terminal region, a first circuit region located at a side of the binding terminal region, and a second circuit region located at a side of the first circuit region away from the binding terminal region; wherein the binding terminal region includes multiple terminals, the first circuit region includes a driver circuit, multiple first signal lines, multiple second signal lines, and multiple third signal lines, and the second circuit region includes an external connector; first ends of the multiple first signal lines, the multiple second signal lines and the multiple third signal lines are correspondingly connected to the terminals of the binding terminal region; second ends of the multiple first signal lines and the multiple second signal lines are respectively connected to the driver circuit; and second ends of the multiple third signal lines are connected to the external connector; and there is no overlap region between an orthographic projection of the multiple first signal lines and the multiple second signal lines on a plane of the flexible printed circuit board and an orthographic projection of the plurality of third signal lines on the plane of the flexible printed circuit board.

In an exemplary embodiment, wherein the multiple terminals in the binding terminal region are disposed along a first direction, and the binding terminal region includes a first terminal region, a middle terminal region and a second terminal region which are disposed in sequence along the first direction; multiple terminals in the first terminal region are correspondingly connected to the first ends of the multiple first signal lines; multiple terminals in the second terminal region are correspondingly connected to the first ends of the multiple second signal lines; multiple terminals in the middle terminal region are correspondingly connected to the first ends of the multiple third signal lines.

In an exemplary embodiment, along the first direction, the driver circuit is located on a side close to the first terminal region, the multiple first signal lines are located in the first circuit region, and second ends of the multiple first signal lines are connected to the driver circuit.

In an exemplary embodiment, along the first direction, the second circuit region is located on a side away from the first terminal region; second ends of the multiple third signal lines extend from the first circuit region to the second circuit region and are connected to the external connector; second ends of the multiple second signal lines extend from the first circuit region to the second circuit region, bypass the third signal lines, extend from the second circuit region to the first circuit region, and connect to the driver circuit.

In an exemplary embodiment, the second signal line includes a first connection line, a turning connection line and a second connection line, which are connected in sequence; the first connection line is located in the first circuit region, a first end of the first connection line is connected to a terminal of the second terminal region, and a second end of the first connection line extends to a junction region between the first circuit region and the second circuit region; the turning connection line is located in the second circuit region, a first end of the turning connection line is connected to the second end of the first connection line, and a second end of the turning connection line extends to the junction region between the first circuit region and the second circuit region after bypassing the third signal lines; the second connection line is located in the first circuit region, a first end of the second connection line is connected to the second end of the turning connection line, and the second end of the turning connection line is connected to the driver circuit.

In an exemplary embodiment, the turning connection line includes a first sub-line, a turning sub-line and a second sub-line, which are connected in sequence; the first sub-line is located on a side of the third signal line away from the driver circuit, and a first end of the first sub-line is connected to a second end of the first connection line located in the junction region, and a second end of the first sub-line extends towards the external connector and is connected to a first end of the turning sub-line; the second sub-line is located on a side of the third signal lines close to the driver circuit; a first end of the second sub-line is connected to the second end of the turning sub-line, and a second end of the second sub-line extends towards the junction region and is connected to the first end of the second connection line located in the junction region; the turning sub-line is located on a side of the external connector away from the first circuit region, and the turning sub-line bypasses the external connector or a terminal in the external connector connected to the third signal line.

In an exemplary embodiment, in a plane perpendicular to the plane of the flexible printed circuit board, the flexible printed circuit board includes a first conductive layer disposed on a first substrate, a first protective layer disposed on a side of the first conductive layer away from the first substrate, and a second protective layer disposed on a side of the first substrate away from the first conductive layer; wherein the first sub-line, the turning sub-line and the second sub-line are all located on the first conductive layer.

In an exemplary embodiment, in a plane perpendicular to the plane of the flexible printed circuit board, the flexible printed circuit board includes a first conductive layer disposed on a first substrate, a first protective layer disposed on a side of the first conductive layer away from the first substrate, a first adhesive layer disposed on a side of the first substrate away from the first conductive layer, a second substrate disposed on a side of the first adhesive layer away from the first substrate, a second conductive layer disposed on a side of the second substrate away from the first substrate and a second protective layer disposed on a side of the second conductive layer away from the first substrate; wherein the first sub-line, the turning sub-line and the second sub-line are all located on the first conductive layer, or the first sub-line, the turning sub-line and the second sub-line are all located on the second conductive layer.

In an exemplary embodiment, in a plane perpendicular to the plane of the flexible printed circuit board, the flexible printed circuit board includes: a first conductive layer disposed on a first substrate, a first protective layer disposed on a side of the first conductive layer away from the first substrate, and a second protective layer disposed on a side of the first substrate away from the first conductive layer; at an end of the second circuit region away from the first circuit region, the second protective layer is provided with a reinforcing structure opening which is provided with a reinforcing structure; wherein the reinforcing structure includes: a reinforcing adhesive layer disposed on a side of the first substrate away from the first conductive layer, a reinforcing substrate disposed on a side of the reinforcing adhesive layer away from the first substrate, a reinforcing conductive layer disposed on the side of the reinforcing substrate away from the first substrate, and a reinforcing protective layer disposed on a side of the reinforcing conductive layer away from the first substrate; the first sub-line and the second sub-line are both located on the first conductive layer, the turning sub-line is located on the reinforcing conductive layer, and the turning sub-line is respectively connected to the first sub-line and the second sub-line through connection columns.

In an exemplary embodiment, in a plane perpendicular to the plane of the flexible printed circuit board, the flexible printed circuit board includes a first conductive layer disposed on a first substrate, a first protective layer disposed on a side of the first conductive layer away from the first substrate, a first adhesive layer disposed on a side of the first substrate away from the first conductive layer, a second substrate disposed on a side of the first adhesive layer away from the first substrate, a second conductive layer disposed on a side of the second substrate away from the first substrate and a second protective layer disposed on a side of the second conductive layer away from the first substrate; at an end of the second circuit region away from the first circuit region, the second protective layer is provided with a reinforcing structure opening which is provided therein with a reinforcing structure; the reinforcing structure includes: a reinforcing adhesive layer disposed on a side of the second conductive layer away from the second substrate, a reinforcing substrate disposed on a side of the reinforcing adhesive layer away from the second substrate, and a reinforcing conductive layer disposed on a side of the reinforcing substrate away from the second substrate, and a reinforcing protective layer disposed on a side of the reinforcing conductive layer away from the second substrate; the first sub-line and the second sub-line are both located on the first conductive layer, the turning sub-line is located on the reinforcing conductive layer, and the turning sub-line is respectively connected to the first sub-line and the second sub-line through connection columns; or, the first sub-line and the second sub-line are both located on the second conductive layer, the turning sub-line is located on the reinforcing conductive layer, and the turning sub-line is respectively connected to the first conductive layer and the second conductive layer through connection columns.

In an exemplary embodiment, the external connector includes a connector; at an end of the second circuit region away from the first circuit region, the first protective layer is provided with a connector opening, and the connector is disposed in the connector opening.

An exemplary embodiment of the present disclosure further provides a display touch apparatus comprising a touch display panel and the aforementioned flexible printed circuit board, wherein the touch display panel includes an effective region and a binding region located at a side of the effective region, the binding region includes a binding pin region which includes multiple pins, and multiple terminals of the binding terminal region in the flexible printed circuit board are correspondingly connected to the multiple pins of the binding pin region.

In an exemplary embodiment, the multiple pins of the binding pin region are disposed along a first direction, and the binding pin region includes a first pin region, a middle pin region and a second pin region which are disposed in sequence along the first direction; multiple terminals in the first terminal region are correspondingly connected to multiple pins in the first pin region, multiple terminals in the second terminal region are correspondingly connected to multiple pins of the second pin region, and multiple terminals in the middle terminal region are correspondingly connected to multiple pins in the middle pin region.

In an exemplary embodiment, the binding region further includes multiple sense leads, multiple drive leads and multiple display leads, wherein the multiple sense leads are correspondingly connected to multiple pins in the first pin region, the multiple drive leads are correspondingly connected to multiple pins in the second pin region, and the multiple display leads are correspondingly connected to multiple pins in the middle pin region.

In an exemplary embodiment, the driver circuit includes a touch IC and the connector includes a board-to-board connector.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of various components in the drawings do not reflect true scales and are only intended to schematically illustrate contents of the present disclosure.

Figure 1:
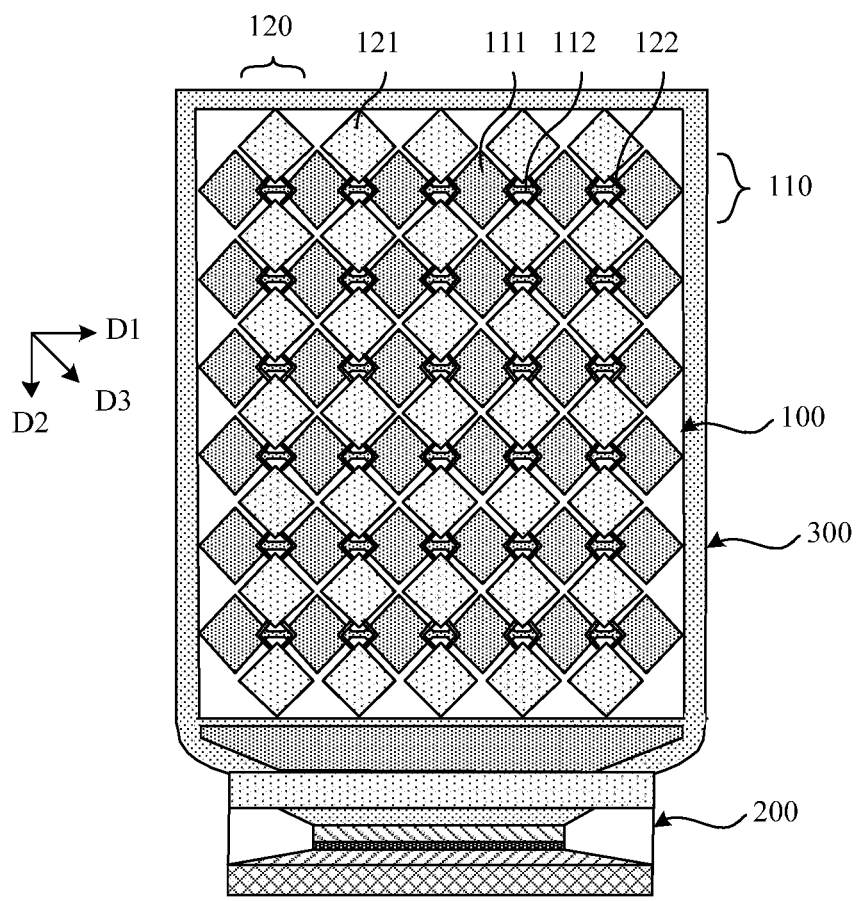
FIG. 1 is a schematic diagram of a planar structure of a display touch apparatus according to an exemplary embodiment of the present disclosure.

for clarity. Therefore, an implementation of the present disclosure is not necessarily limited to the sizes shown. The shapes and sizes of various components in the drawings do not reflect true scales. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientational or positional relations, to describe the positional relations between constituent elements with reference to the drawings, are only for a purpose of facilitating description of this specification and simplifying the description, rather than indicating or implying that the apparatus or element referred to must have a specific orientation, or must be constructed and operated in a particular orientation, and therefore may not be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless other-

| Description of reference signs: | | |
|---|---|---|
| 10-first substrate; | 11-first conductive layer; | 12-first protective layer; |
| 13-first shielding layer; | 14-first adhesive layer; | 20-second substrate; |
| 21-second conductive layer; | 22-second protective layer; | 23-second shielding layer; |
| 50-reinforcing substrate; | 51-reinforcing conductive layer; | 52-reinforcing protective layer; |
| 53-reinforcing adhesive layer; | 61-first connection column; | 62-second connection column; |
| 100-touch region; | 101-substrate; | 102-driver circuit layer; |
| 103-light-emitting device; | 104-encapsulation layer; | 105-buffer layer; |
| 106-first metal mesh layer; | 107-insulating layer; | 108-second metal mesh layer; |
| 109-protective layer, | 110-first touch unit; | 111-first touch electrode; |
| 112-first connection portion; | 120-second touch unit; | 121-second touch electrode; |
| 122-second connection portion; | 200-binding region; | 201-first fan-out region; |
| 202-bending region; | 203-second fan-out region; | 204-antistatic region; |
| 205-drive chip region; | 206-binding pin region; | 300-edge region; |
| 301-sense lead; | 302-drive lead; | 400-flexible printed circuit board; |
| 401-sense signal line; | 402-sense signal line; | 403-display signal line; |
| 404-junction region; | 410-touch driver circuit | 411-first connection line; |
| 412-turning connection line; | 413-second connection line; | 420-connector; |
| 421-first sub-line; | 422-turning sub-line; | 423-second sub-line; |
| 431-binding terminal region; | 432-first circuit region; | 433-second circuit region; |
| 601-first cutting line; | 602-second cutting line; | |

DETAILED DESCRIPTION

Embodiments of the present disclosure will be described in detail hereinafter with reference to the accompanying drawings. It should be noted that the embodiments may be implemented in many different forms. Those of ordinary skills in the art may readily understand the fact that implementations and contents may be transformed into a variety of forms without departing from the essence and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements and thicknesses and regions of layers are sometimes exaggerated wise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (drain electrode terminal, drain region or drain electrode) and the source electrode (source electrode terminal, source region or source electrode), and a current may flow through the drain electrode, the channel region and the source electrode. It should be noted that in this specification, the channel region refers to a region through which the current mainly flows.

In this specification, the first electrode may be a drain electrode and the second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during operation of the circuit. Therefore, in this specification, "source electrode" and "drain electrode" are interchangeable.

In this specification, an "electrical connection" includes a case where constituent elements are connected together through an element with a certain electric action. The "element with a certain electric action" is not particularly limited as long as it may transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10° and below 10°, and thus also includes a case where the angle is above −5° and below 5°. In addition, "perpendicular" refers to a case where an angle formed by two straight lines is above 80° and below 100°, and thus also includes a case where the angle is above 85° and below 95°.

In this specification, "film" and "layer" may be interchangeable. For example, sometimes "conductive layer" may be replaced by "conductive film". Similarly, "insulating film" may sometimes be replaced by "insulating layer".

"About" in the present disclose means that limits of a value are not limited strictly, and the value is within a range of process and measurement errors.

Touch panels of capacitive On Cell type are mainly divided into touch panels with a Mutual Capacitance structure and touch panels with a Self Capacitance structure. The mutual capacitance structure is composed of a first touch electrode and a second touch electrode and changes of the mutual capacitance is used for position detection. The self-capacitance structure is composed of a touch electrode and a human body, and changes of the self-capacitance are used for position detection. A self-capacitance touch panel has a single-layer structure with features such as low power consumption and simple structure, while a mutual capacitance touch panel has a multi-layer structure with features such as multi-touch.

A display touch apparatus of an exemplary embodiment of the present disclosure may include a display panel disposed on a substrate and a touch panel disposed on the display panel. The display panel may be a Liquid Crystal Display panel (LCD), an Organic Light Emitting Diode (OLED) display panel, a plasma display panel (PDP), or an Electrophoretic display (EPD) panel. In an exemplary embodiment, the display panel may be an OLED display panel. An OLED is an active light emitting display device that has advantages, such as self-luminescence, wide viewing angle, high contrast, low power consumption, and extremely high response speed. With the continuous development of display technology, a flexible display apparatus with an OLED as a light-emitting device and a Thin Film Transistor (TFT) for performing signal control has become a mainstream product in the current display field. According to product requirements such as flexible folding and narrow bezel, etc., the existing touch structure based on the OLED adopts a structural form of Flexible Multi-Layer On Cell (FMLOC). The display structure and the touch structure are both integrated on the substrate, and the touch panel is disposed on an encapsulation layer of an OLED back panel to form an on-cell structure, which has advantages of lightness, thinness, and foldability, and may meet product requirements of flexible folding and narrow bezels.

FIG. 1 is a schematic diagram of a planar structure of a display touch apparatus according to an exemplary embodiment of the present disclosure. The touch panel is disposed on a display panel to form an FMLOC structure form. In a plane parallel to the touch panel, the touch panel includes an effective region (or effective region, AA), a binding region on one side of the effective region, and an edge region on the other side of the effective region. For the display panel and the touch panel which are stacked, the effective region may be either a touch region of the touch panel or a display region of the display panel, and both the touch region and the display region in the following description refer to the effective region. In an exemplary embodiment, a touch region 100 at least includes multiple touch electrodes disposed regularly, an edge region 300 at least includes multiple touch leads, and a binding region 200 at least includes pins connecting the touch leads to an external control apparatus.

In an exemplary embodiment, the touch panel may have a mutual capacitance structure. The touch region 100 may include multiple first touch units 110 and multiple second touch units 120, wherein the first touch units 110 have a linear shape extending along a first direction D1 and the multiple first touch units 110 are disposed in sequence along a second direction D2. The second touch units 120 have a linear shape extending along the second direction D2 and the multiple second touch units 120 are disposed in sequence along the first direction D1, wherein the first direction D1 intersects with the second direction D2. Each first touch unit 110 includes multiple first touch electrodes 111 and first connection portions 112 which are disposed in sequence along the first direction D1, and the first touch electrodes 111 and the first connection portion 112 are alternately disposed and in sequence connected. Each second touch unit 120 includes multiple second touch electrodes 121 disposed in sequence along the second direction D2, and the multiple second touch electrodes 121 are disposed at intervals, wherein adjacent second touch electrodes 121 are connected to each other via second connection portions 122. In an exemplary embodiment, a film layer where the second connection portions 122 are located is different from a film layer where the first touch electrodes 111 and the second touch electrodes 121 are located. The first touch electrodes 111 and the second touch electrodes 121 are alternately disposed along a third direction D3, wherein the third direction D3 intersects with the first direction D1 and the second direction D2.

In an exemplary embodiment, the multiple first touch electrodes 111, the multiple second touch electrodes 121, and the multiple first connection portions 112 may be disposed on a same layer, i.e., a touch layer and may be formed by a same patterning process, and the first touch electrodes 111 and the first connection portions 112 may be connected to each other in an integrated structure. The second connection portions 122 may be disposed on a bridging layer, and adjacent second touch electrodes 121 are connected to each other through via holes. An insulating layer is disposed between the touch layer and the bridging layer. In some possible implementations, the multiple first touch electrodes 111, the multiple second touch electrodes 121 and the multiple second connection portions 122 may be disposed on the same layer, i.e., the touch layer, wherein the second touch electrodes 121 and the second connection portions 122 may be connected to each other in an integrated structure. The first connection portions 112 may be disposed on the bridging layer and adjacent first touch electrodes 111 are connected to each other through via holes. In an exemplary embodiment, the first touch electrodes may be driver electrodes (Tx) and the second touch electrodes may be sensor electrodes (Rx). Or, the first touch electrodes may be sensor electrodes (Rx) and the second touch electrodes may be driver electrodes (Tx).

In an exemplary embodiment, the first touch electrodes 111 and the second touch electrodes 121 may have rhombic shapes, such as regular rhombic shapes, horizontally longer rhombic shapes, or longitudinally longer rhombic shapes. In some possible implementations, the first touch electrodes 111 and the second touch electrodes 121 may have any one or more of shapes of triangles, squares, trapezoids, parallelograms, pentagons, hexagons and other polygons, which are not limited in the present disclosure In an exemplary embodiment, the first touch electrodes 111 and the second touch electrodes 121 may be in a form of transparent conductive electrodes. In another exemplary embodiment, the first touch electrodes 111 and the second touch electrodes 121 may be in a form of a metal mesh. The metal mesh is formed by multiple interweaving metal wires and includes multiple grid pattern units, wherein the grid pattern units are polygons formed by the multiple metal wires. The first touch electrodes 111 and the second touch electrodes 121 with a layout of metal mesh have advantages of low resistance, small thickness, fast response speed and the like.

Figure 2:
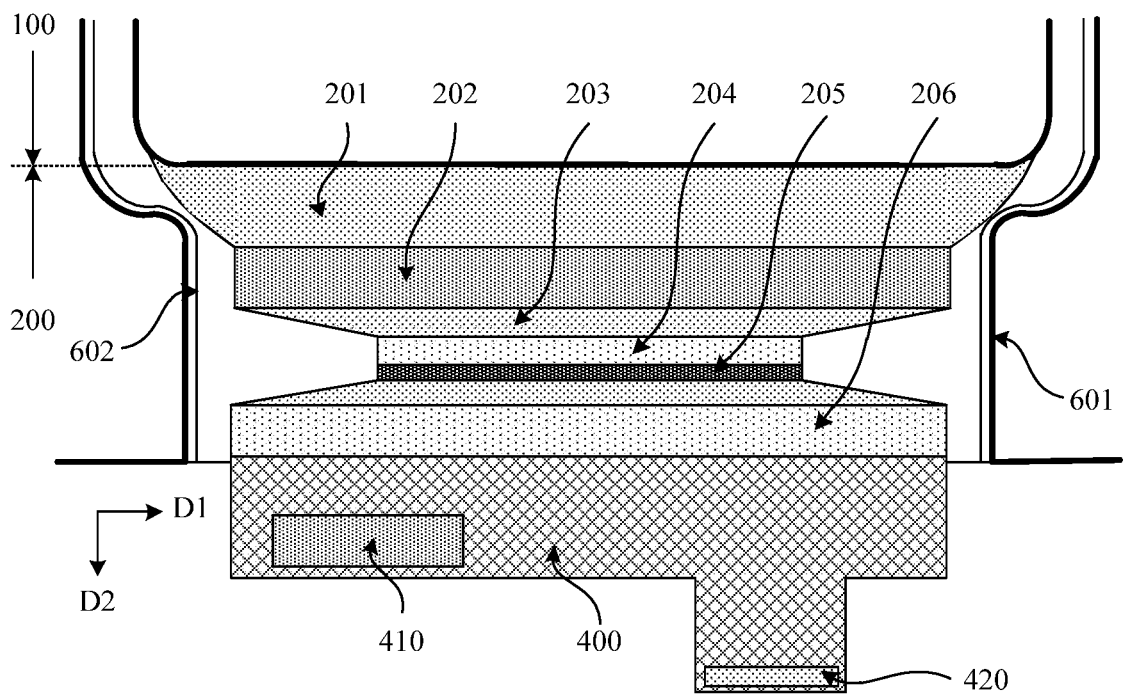
FIG. 2 is a schematic diagram of a structure of a binding region according to an exemplary embodiment of the present disclosure.

FIG. 2 is a schematic diagram of a structure of a binding region according to an exemplary embodiment of the present disclosure. As shown in FIG. 2, in an exemplary embodiment, the binding region 200 is located on a side of the touch region 100, and along a direction away from the touch region 100 (the second direction D2), the binding region 200 may include a first fan-out region 201, a bending region 202, a second fan-out region 203, an antistatic region 204, a drive chip region 205, and a binding pin region 206 which are disposed in sequence. The first fan-out region 201 may be provided with a signal transmission line of the display panel and a touch lead of the touch panel. The signal transmission line of the display panel at least includes a first power supply line (VDD), a second power supply line (VSS) and multiple data transmission lines, wherein the multiple data transmission lines are configured to be connected to data lines of the display region 100 in a fan-out manner, the first power supply line VDD is configured to be connected to a high-level power supply line of the display panel and the second power supply line VSS is configured to be connected to a low-level power supply line of the display panel. The multiple touch leads of the touch panel are configured to be correspondingly connected to multiple pins of the binding pin region 206. The bending region 202 may be provided with a groove configured to make the second fan-out region 203, the antistatic region 204, the drive chip region 205 and the binding pin region 206 bend to the back of the touch region 100. The second fan-out region 203 may be provided with multiple touch leads and multiple data transmission lines which are led out in a fan-out manner. The antistatic region 204 may be provided with an antistatic circuit configured to eliminate static electricity. The drive chip region 205 may be provided with a source Driver IC (integrated circuit), which is configured to be connected to the multiple data transmission lines of the second fan-out region 203. The binding pin region 206 may be provided with multiple pins, which are correspondingly connected to multiple touch leads and multiple display signal lines of the source driver IC, and the binding pin region 206 is configured to be bound and connected to a Flexible Printed Circuit board (FPC) 400.

In an exemplary embodiment, the flexible printed circuit board 200 at least includes a Touch IC 410 and a connector 420, wherein multiple touch leads are connected to the Touch IC 410, and multiple display signal lines are connected to the connector 420.

In an exemplary embodiment, a first cutting line 601 and a second cutting line 602 are disposed outside the binding region 200. The second cutting line 602 is a fine cutting line which is located at the periphery of the binding region 200 and the second cutting line 602 has a same shape as an outline of the binding region 200. The first cutting line 601 is a rough cutting line which is located at the periphery of the second cutting line 602 and the first cutting line 601 has the same shape as the outline of the second cutting line 602. After a film layer process is completed, cutting equipment cuts along the first cutting line 601 (rough cutting line), and after a test is completed, cutting equipment cuts along the second cutting line 602 (fine cutting line), such that the display panel and the touch panel are formed.

Figure 3:
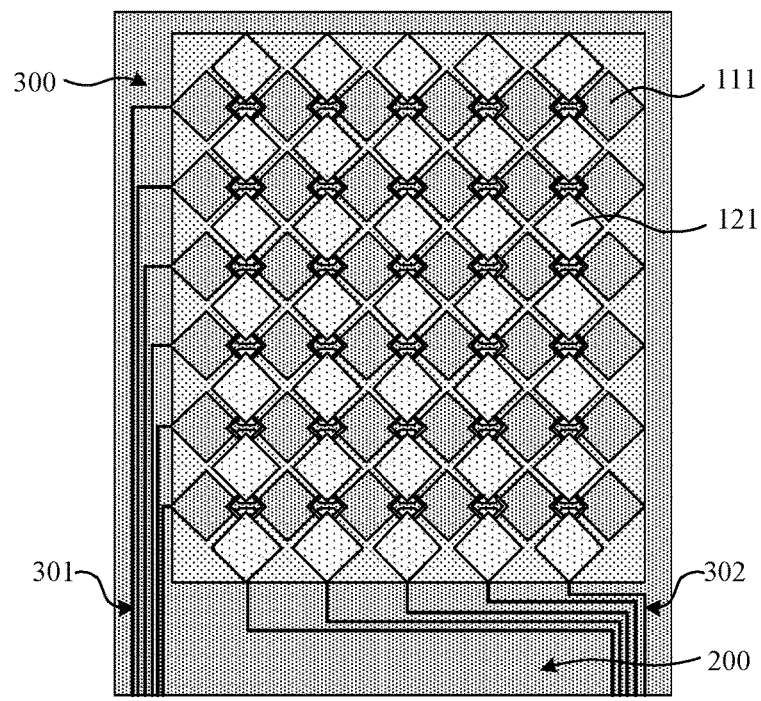
FIG. 3 is a schematic diagram of a structure of an edge region according to an exemplary embodiment of the present disclosure.

FIG. 3 is a schematic diagram of a structure of an edge region according to an exemplary embodiment of the present disclosure. As shown in FIG. 3, in an exemplary embodiment, the edge region 300 is located on a side of the touch region 100 besides the side where the binding region 200 is located. In an exemplary embodiment, the first touch electrode 111 is a sense (Rx) electrode, and the second touch electrode 121 is a drive (Tx) electrode. In an exemplary embodiment, the edge region 300 is provided with multiple sense (Rx) leads 301 and multiple drive (Tx) leads 302. A first end of a drive lead 302 is connected to a drive electrode, and a second end of the drive lead 302 extends to one side of the binding region 200. A first end of the sense lead 301 is connected to a sense electrode, and a second end of the sense lead 301 extends along the edge region 300 to the other side of the binding region 200. In an exemplary embodiment, the sense lead 301 together with the drive lead 302 constitutes a touch lead.

Figure 4:
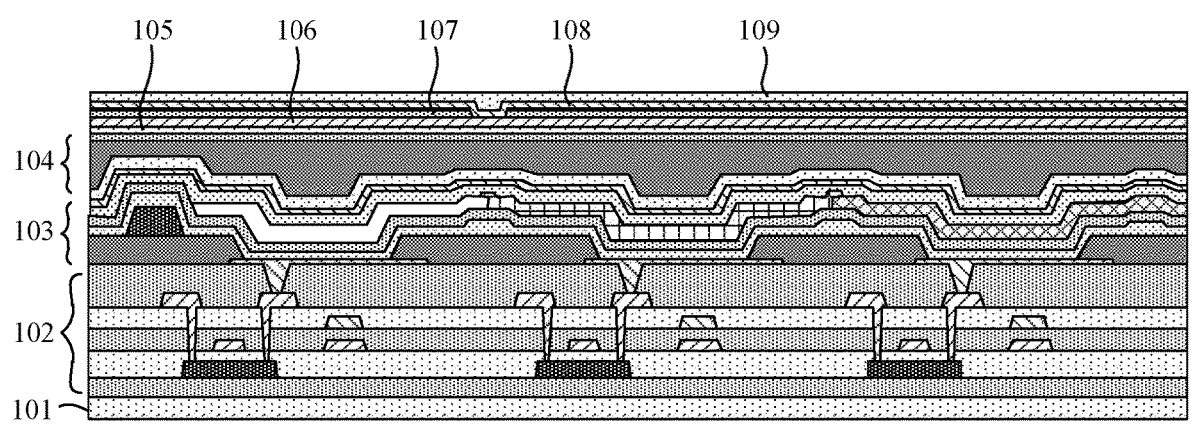
FIG. 4 is a sectional schematic diagram of a structure of a display touch apparatus according to an exemplary embodiment of the present disclosure.

FIG. 4 is a schematic diagram of a sectional structure of a display touch apparatus according to an exemplary embodiment of the present disclosure, showing a structure of three sub-pixels. As shown in FIG. 4, a touch panel is disposed on a display panel. In an exemplary embodiment, on a plane perpendicular to the display panel, the display panel may include a driver circuit layer 102 disposed on a substrate 101, a light-emitting device 103 disposed on a side of the driver circuit layer 102 away from the substrate 101, and an encapsulation layer 104 disposed on a side of the light-emitting device 103 away from the substrate 101. In some possible implementations, the display panel may include other film layers, such as spacer posts, etc., which are not limited in the present disclosure.

In an exemplary implementation, the substrate may be a flexible substrate or may be a rigid substrate. The flexible substrate may include a first flexible material layer, a first inorganic material layer, a semiconductor layer, a second flexible material layer and a second inorganic material layer which are stacked. Materials of the first flexible material layer and the second flexible material layer may be polyimide (PI), polyethylene terephthalate (PET) or a polymer soft film with surface treatment. Materials of the first inorganic material layer and the second inorganic material layer may be silicon nitride (SiNx) or silicon oxide (SiOx), etc., for improving water-resistance and oxygen-resistance capabilities of the substrate; and the material of the semiconductor layer may be amorphous silicon (a-si).

In an exemplary embodiment, the driver circuit layer 102 of each sub-pixel may include multiple transistors and storage capacitors constituting a pixel driver circuit. An example in which each sub-pixel includes one drive transistor and one storage capacitor is illustrated in FIG. 4. In some possible implementations, the driver circuit layer 102 of each sub-pixel may include: a first insulating layer disposed on the substrate; an active layer disposed on the first insulating layer; and a second insulating layer covering the active layer; a gate electrode and a first capacitor electrode disposed on the second insulating layer; a third insulating layer covering the gate electrode and the first capacitor electrode; a second capacitor electrode disposed on the third insulating layer; a fourth insulating layer covering the second capacitor electrode, via holes formed on the second insulating layer, the third insulating layer, and the fourth insulating layer which expose the active layer; a source electrode and a drain electrode disposed on the fourth insulating layer, which are respectively connected to the active layer through via holes; a planarization layer covering the aforementioned structure wherein the planarization layer is provided with via holes, and the via holes expose the drain electrode. The active layer, the gate electrode, the source electrode and the drain electrode constitute the drive transistor, and the first capacitor electrode and the second capacitor electrode constitute the storage capacitor.

In an exemplary embodiment, a light-emitting device 103 may include an anode, a pixel definition layer, an organic light-emitting layer and a cathode. The anode is disposed on the planarization layer, and is connected to the drain electrode of the drive transistor through a via hole formed on the planarization layer; the pixel definition layer is disposed on the anode and the planarization layer, and the pixel definition layer is provided with a pixel opening exposing the anode; the organic light-emitting layer is at least partially disposed in the pixel opening, and is connected to the anode; the cathode is disposed on the organic light-emitting layer, and is connected to the organic light-emitting layer; and the organic light-emitting layer emits light of corresponding colors under the drive of the anode and the cathode.

In an exemplary implementation, the encapsulation layer 104 may include a first encapsulation layer, a second encapsulation layer and a third encapsulation layer that are stacked; the first encapsulation layer and the third encapsulation layer may be made of an inorganic material, and the second encapsulation layer may be made of an organic material; the second encapsulation layer is disposed between the first encapsulation layer and the third encapsulation layer to ensure that external moisture may not enter into the light-emitting device 103.

In an exemplary embodiment, the organic light-emitting layer of the OLED light-emitting device may include an Emitting Layer (EML), and one or more film layers of a Hole Injection Layer (HIL), a Hole Transport Layer (HTL), a Hole Block Layer (HBL), an Electron Block Layer (EBL), an Electron Injection Layer (EIL) and an Electron Transport Layer (ETL). Driven by voltages of the anode and the cathode, light is emitted using the light-emitting characteristics of the organic material according to required gray scales.

In an exemplary embodiment, the light-emitting layers of OLED light-emitting devices of different colors are different. For example, a red light-emitting device includes a red light-emitting layer, a green light-emitting device includes a green light-emitting layer, and a blue light-emitting device includes a blue light-emitting layer. In order to reduce the process difficulty and improve the yield, a common layer may be used for the hole injection layer and the hole transport layer on one side of the light-emitting layer, and a common layer may be used for the electron injection layer and the electron transport layer on the other side of the light-emitting layer. In an exemplary embodiment, any one or more layers of the hole injection layer, the hole transport layer, the electron injection layer and the electron transport layer may be manufactured by one-time process (one-time evaporation process or one-time ink-jet printing process), while isolation is realized by the height difference of the formed film layers or by the surface treatment. For example, any one or more layers of the hole injection layer, the hole transport layer, the electron injection layer and the electron transport layer corresponding to adjacent sub-pixels may be isolated. In an exemplary embodiment, the organic light-emitting layer may be formed by evaporation using a Fine Metal Mask (FMM) or an Open Mask, or by an ink jet process.

In an exemplary embodiment, on a plane perpendicular to the touch panel, the touch panel may include a Buffer layer 105 disposed on a side of the encapsulation layer 104 away from the substrate 101; a first metal mesh layer (TMA) 106 disposed on a side of the buffer layer 105 away from the substrate 101; an insulating layer 107 disposed on a side of the first metal mesh layer 106 away from the substrate 101; a second metal mesh (TMB) layer 108 disposed on a side of the insulating layer 107 away from the substrate 101, and a protective layer 109 disposed on a side of the second metal mesh layer 108 away from the substrate 101.

In an exemplary embodiment, the buffer layer 105 and the insulating layer 107 may be made of any one or more of silicon oxide (SiOx), silicon nitride (SiNx), and silicon oxynitride (SiON), and may be a single layer, multi-layer or composite layer. The first metal mesh layer 106 and the second metal mesh layer 108 may be made of a metal material, such as any one or more of silver (Ag), copper (Cu), aluminum (Al), titanium (Ti), and molybdenum (Mo), or alloy materials of the aforementioned metals, and the protective layer 109 may be made of an organic material.

In an exemplary embodiment, the first metal mesh layer 106 may be called a bridging layer, and the second metal mesh layer 108 may be called a touch layer. Multiple first touch electrodes, second touch electrodes and first connection portions may be disposed on a same layer on the touch layer, and second connection portions may be disposed on the bridging layer, so that adjacent second touch electrodes are connected to each other through via holes.

In an exemplary embodiment, the display touch apparatus may be any product or component with a display function, such as a mobile phone, a tablet computer, a television, a display, a laptop computer, a digital photo frame, a navigator, etc.

At present, an integration degree of a display apparatus is becoming increasingly high, and a display touch apparatus in which display and touch control are integrated on a panel has advantages such as low cost and small thickness, which has become a development trend. As the degree of integration increases, the display touch apparatus has problems such as higher production costs.

Figure 5:
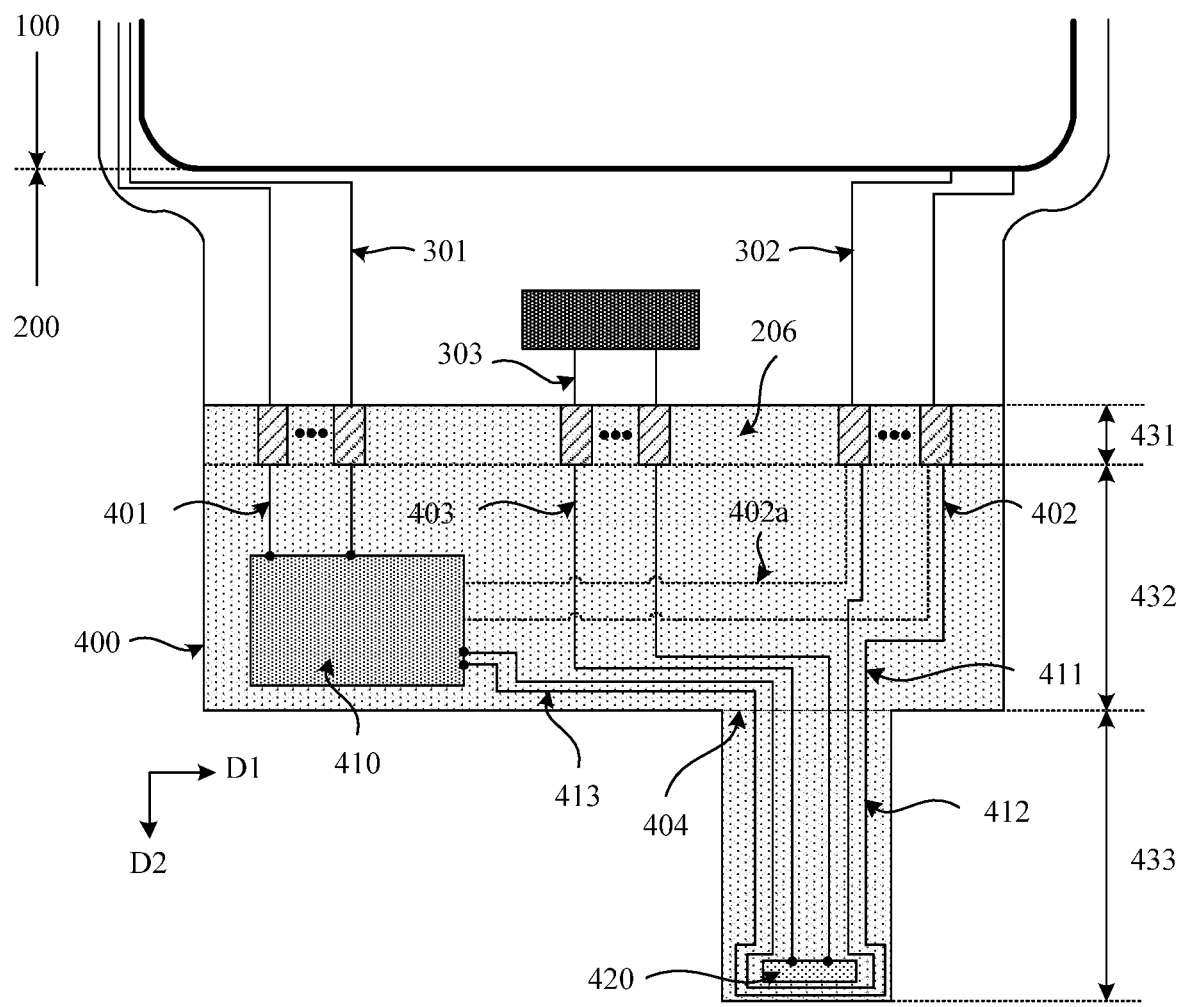
FIG. 5 is a schematic diagram of binding connection of a flexible printed circuit board according to an exemplary embodiment of the present disclosure.

FIG. 5 is a schematic diagram of a binding connection of a flexible printed circuit board according to an exemplary embodiment of the present disclosure. As shown in FIG. 5, in an exemplary embodiment, along a direction parallel to an edge of a binding region (a first direction D1), the binding region 200 may be divided into a first side region, a middle region, and a second side region. The edge of the binding region is an edge of the binding region adjacent to a touch region. In the following description, a left side of the binding region refers to a first side region of the binding region, a right side of the binding region refers to the second side region of the binding region, and a middle of the binding region refers to a middle region between the left side of the binding region and the right side of the binding region. In an exemplary embodiment, a binding pin region 206 in the binding region 200 may include a first pin region located in the first side region, a middle pin region located in the middle region and a second pin region located in the second side region. The first pin region, the middle pin region, and the second pin region each include multiple pins.

In an exemplary embodiment, multiple sense leads 301 are introduced from the touch region 100 to the left side of the binding region, extend to the first pin region at the left side of the binding region, and are correspondingly connected to multiple pins of the first pin region. Multiple drive leads 302 are introduced from the touch region 100 to the right side of the binding region, extend to the second pin region at the right side of the binding region, and are correspondingly connected to multiple pins of the second pin region. Multiple display leads 303 are introduced to the middle pin region from a source driver IC located in the middle of the binding region, and are correspondingly connected to multiple pins in the middle pin region.

In an exemplary embodiment, a flexible printed circuit board 400 is located on a side of the binding region 200 away from the touch region 100, and along a direction away from the touch region 100 (a second direction D2), the flexible printed circuit board 400 may include a binding terminal region 431, a first circuit region 432, and a second circuit region 433 which are disposed in sequence.

The binding terminal region 431 may include multiple terminals, wherein the multiple terminals are correspondingly connected to multiple pins of the binding pin region 206. The first circuit region 432 may at least include a touch driver circuit (Touch IC) 410, wherein the Touch IC 410 is configured to be connected to multiple drive signal lines and multiple sense signal lines on the flexible printed circuit board 400. The second circuit region 433 may at least include a connector 420 configured to be connected to the multiple display signal lines on the flexible printed circuit board 400.

In an exemplary embodiment, multiple terminals in the binding terminal region 431 are regularly disposed along the first direction D1, and the binding terminal region 431 may include a first terminal region, a middle terminal region and a second terminal region. A position of the first terminal region corresponds to a position of the first pin region of the binding region, and multiple terminals of the first terminal region are correspondingly connected to multiple pins of the first pin region. A position of the middle terminal region corresponds to a position of the middle pin region of the binding region, and multiple terminals of the middle terminal region are correspondingly connected to multiple pins of the middle region. A position of the second terminal region corresponds to a position of the second pin region of the binding region, and multiple terminals of the second terminal region are correspondingly connected to multiple pins of the second pin region.

In an exemplary embodiment, the first circuit region 432 may be rectangular, and the first circuit region 432 may include a touch IC 410, multiple sense signal lines 401, multiple drive signal lines 402, and multiple display signal lines 403. Along the first direction D1, the touch IC 410 may be located on a side of the first circuit region close to the first terminal region, that is, on a left side of the flexible printed circuit board 400.

In an exemplary embodiment, the second circuit region 433 may be rectangular, and the second circuit region 433 may include a connector 420, multiple drive signal lines 402, and multiple display signal lines 403. Along the first direction D1, a width of the second circuit region 433 is smaller than a width of the first circuit region 432, and the second circuit region 433 may be located on a side away from the first terminal region, that is, on a right side of the flexible printed circuit board 400. In an exemplary embodiment, the connector 420 is located at an end of the second circuit region 433 on a side away from the first circuit region 432.

In an exemplary embodiment, the sense signal lines 401 serve as first signal lines, the drive signal lines 402 serve as second signal lines, the display signal lines 403 serve as third signal lines, the touch IC 410 serves as a driver circuit, and the connector 420 serves as an external connector. In an exemplary embodiment, the connector may be a Board-to-board (BTB) connector.

In an exemplary embodiment, the multiple sense signal lines 401 (the first signal lines) are only disposed in the first circuit region 432. First ends of the multiple sense signal lines 401 are correspondingly connected to multiple terminals in the first terminal region, and are correspondingly connected to multiple sense leads 301 on the left side of the binding region through multiple terminals in the first terminal region and multiple pins in the first pin region. Second ends of the multiple sense signal lines 401 extend to the touch IC 410 and are connected to the touch IC 410 located in the first circuit region, thus achieving a connection between the touch IC 410 and the multiple sense leads 301 in the binding region, and making the touch IC 410 provide touch sense signals to the multiple sense leads 301. In an exemplary embodiment, the sense signal lines 401 may be straight lines extending along the second direction D2, or may be fold lines. Since the first terminal region and the touch IC 410 are both located on the left side of the flexible printed circuit board 400, and the multiple sense signal lines 401 are also located on the left side of the flexible printed circuit board 400, it is realized that the multiple sense signal lines 401 and the multiple display signal lines 403 do not overlap in the first circuit region.

In an exemplary embodiment, the drive signal lines 402 (the second signal lines) are respectively disposed in the first circuit region 432 and the second circuit region 433. First ends of the multiple drive signal lines 402 are correspondingly connected to multiple terminals in the second terminal region, and are correspondingly connected to multiple drive leads 302 in the binding region through multiple terminals in the second terminal region and multiple pins in the second pin region. Second ends of the multiple drive signal lines 402 extend from the first circuit region 432 to the second circuit region 433, and then extending from the second circuit region 433 to the first circuit region 432 after bypassing the multiple display signal lines 403, then the multiple drive signal lines 402 are connected to the touch IC 410 located in the first circuit region, thus realizing a connection between the touch IC 410 and the multiple drive leads 302 in the binding region, making the touch IC 410 provide touch sense signals to the multiple drive leads 302. Since the second terminal region and the second circuit region 433 are both located on the right side of the flexible printed circuit board 400, and the multiple drive signal lines 402 bypass the multiple display signal lines 403, it is realized that the multiple drive signal lines 402 and the multiple display signal lines 403 do not overlap in the first circuit region and the second circuit region.

In an exemplary embodiment, the multiple display signal lines 403 (the third signal lines) are respectively disposed in the first circuit region 432 and the second circuit region 433. First ends of the multiple display signal lines 403 are correspondingly connected to multiple terminals in the middle terminal region, and are correspondingly connected to the multiple display leads 303 in the binding region through the multiple terminals in the middle terminal region and multiple pins in the middle pin region. Second ends of the multiple display signal lines 403 extend from the first circuit region 432 to the second circuit region 433, and are connected to the connector 420 located in the second circuit region, thus realizing a connection between the connector 420 and the multiple display leads 303 in the binding region, so that an external control apparatus may provide display signals to the multiple display leads 303 through the connector 420. In an exemplary embodiment, the display signal lines 403 may be straight lines extending along the second direction D2, or may be fold lines. In an exemplary embodiment, the fold lines may include at least one first straight line extending along the first direction D1 and at least two second straight lines extending along the second direction D2, and the first straight line and the second straight lines are connected in sequence.

In an exemplary embodiment, a drive signal line 402 may include a first connection line 411, a turning connection line 412, and a second connection line 413 which are connected in sequence.

In an exemplary embodiment, the first connection line 411 is located in the first circuit region 432, and a first end of the first connection line 411 serves as a first end of the drive signal line 402, and is correspondingly connected to the multiple terminals of the second terminal region. A second end of the first connection line 411 extends to a junction region 404 between the first circuit region and the second circuit region. In an exemplary embodiment, the first connection line 411 may be a straight line extending along the second direction D2, or may be a fold line. In an exemplary embodiment, the fold line may include at least one first straight line extending along the first direction D1 and at least two second straight lines extending along the second direction D2, wherein the first straight line and the second straight lines are connected in sequence.

In an exemplary embodiment, the turning connection line 412 is located in the second circuit region 433, wherein a first end of the turning connection line 412 is connected to the second end of the first connection line 411 located in the junction region 404, and a second end of the turning connection line 412 first extends towards the connector 420, bypasses the connector 420, then extends in a direction away from the connector 420, and extends to the junction region 404 between the first circuit region and the second circuit region.

In an exemplary embodiment, the second connection line 413 is located in the first circuit region 432, and a first end of the second connection line 413 is connected to the second end of the turning connection line 412 located in the junction region 404. A second end of the second connection line 413, as a second end of the drive signal line 402, extends to the touch IC 410 and is connected to the touch IC 410. In an exemplary embodiment, the second connection line 413 may be a straight line extending in an opposite direction of the first direction D1, or may be a fold line. In an exemplary embodiment, the fold line may include at least two first straight lines extending in the opposite direction of the first direction D1 and at least one second straight line extending in an opposite direction of the second direction D2, wherein the first straight lines and the second straight line are connected in sequence.

In an exemplary embodiment, there is no overlap region between an orthographic projection of the display signal lines 403 on the substrate and an orthographic projection of the sense signal lines 401 on the substrate, and there is no overlap region between the orthographic projection of the display signal lines 403 on the substrate and an orthographic projection of the drive signal lines 402 on the substrate; and there is no overlap region between the orthographic projection of the sensing signal lines 401 on the substrate and the orthographic projection of the drive signal lines 402 on the substrate.

Figure 6:
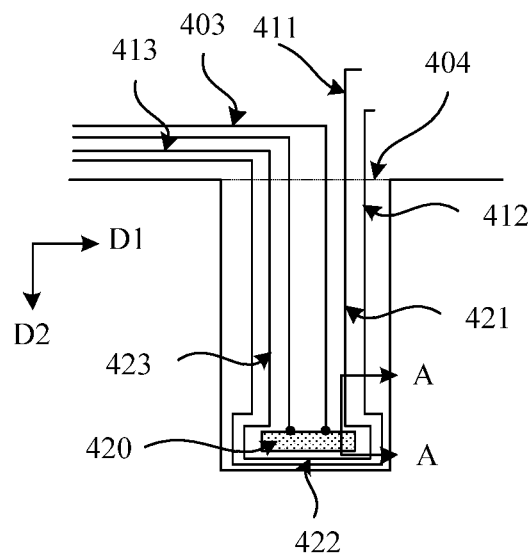
FIG. 6 is a schematic diagram of wiring of a turning connection line according to an exemplary embodiment of the present disclosure.

FIG. 6 is a schematic diagram of wiring of a turning connection line according to an exemplary embodiment of the present disclosure. As shown in FIG. 5 and FIG. 6, the turning connection line 412 located in the second circuit region is configured to form wiring bypassing the connector 420 in the second circuit region 433, so that a drive signal line 402 may avoid crossing a display signal line 403, that is, there is no overlap region between the orthographic projection of the drive signal line 402 on the substrate and the orthographic projection of the display signal line 403 on the substrate.

In an exemplary embodiment, the second circuit region 433 may be rectangular and disposed at a side of the first circuit region 432 away from the binding terminal region 431. The connector 420 may be rectangular and disposed at an end of the second circuit region 433 away from the first circuit region 432. Multiple third signal lines 403 are located in a middle region of the second circuit region 433 in the first direction D1, and the multiple third signal lines 403 extend to the connector 420 along the second direction D2 and are connected to the connector 420. In an exemplary embodiment, the multiple third signal lines 403 may be straight lines or fold lines.

In an exemplary embodiment, the second circuit region 433 has a first region, a second region and a third region. The first region may be located on a side of the third signal line 403 away from the touch IC 410 in the first direction D1, or on a side of the connector 420 away from the touch IC 410 in the first direction D1. The second region may be located on a side of the third signal line 403 close to the touch IC 410 in the first direction D1, or on a side of the connector 420 close to the touch IC 410 in the first direction D1. The third region may be located on a side of the connector 420 away from the touch IC 410 in the second direction D2.

In an exemplary embodiment, the turning connection line 412 includes a first sub-line 421, a turning sub-line 422 and a second sub-line 423 connected in sequence. The first sub-line 421 is located in a first region of the second circuit region 433, and may be a straight line or a fold line. A first end of the first sub-line 421 serves as a first end of the turning connection line 412, and is connected to a second end of the first connection line 411 located in the junction region 404. A second end of the first sub-line 421 extends along the second direction D2 and extends to a third region of the second circuit region 433. The turning sub-line 422 is located in the third region of the second circuit region 433, and may be a straight line or a fold line. A first end of the turning sub-line 422 is connected to a second end of the first sub-line 421, and a second end of the turning sub-line 422 extends in an opposite direction of the first direction D1. The second sub-line 423 is located in a second region of the second circuit region 433, and may be a straight line or a fold line. A first end of the second sub-line 423 is connected to the second end of the turning sub-line 422. A second end of the second sub-line 423 extends to the junction region 404 along an opposite direction of the second direction D2. The second end of the second sub-line 423 serves as a second end of the turning connection line 412 and is connected to a first end of the second connection line 413 located in the junction region 404. Since the first sub-line 421 is located on a right side of the third signal line 403, the turning sub-line 422 is located on a lower side of the connector 420 and the second sub-line 423 is located on a left side of the third signal line 403, there is no overlap region between an orthographic projection of the turning sub-line 412 on the substrate and an orthographic projection of the display signal line 403 on the substrate and there is no overlap region between the orthographic projection of the turning connecting line 412 on the substrate and an orthographic projection of the connector 420 on the substrate, it is realized that the turning connection line 412 bypasses the display signal line 403 and the connector 420.

Figure 7:
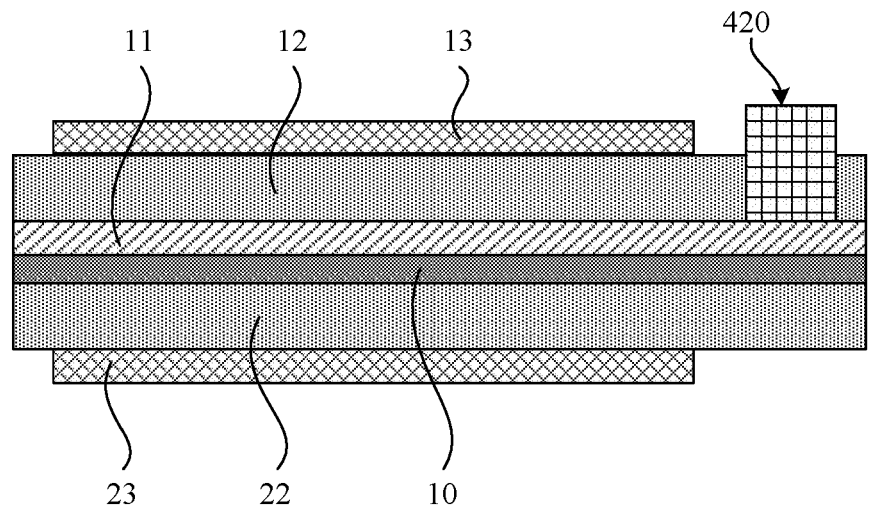
FIG. 7 is a schematic diagram of a film layer structure of a flexible printed circuit board according to an exemplary embodiment of the present disclosure.

FIG. 7 is a schematic diagram of a film layer structure of a flexible printed circuit board according to an exemplary embodiment of the present disclosure, which is a sectional view taken along an A-A direction in FIG. 6. As shown in FIG. 6 and FIG. 7, in a plane perpendicular to a plane of the flexible printed circuit board, a main structure of the flexible printed circuit board includes a first conductive layer 11 disposed on a first substrate 10; a first protective layer 12 disposed on a side of the first conductive layer 11 away from the first substrate 10; a first shielding layer 13 disposed on a side of the first protective layer 12 away from the first substrate 10; a second protective layer 22 disposed on a side of the first substrate 10 away from the first conductive layer 11; and a second shielding layer 23 disposed on a side of the second protective layer 22 away from the first substrate 10, thus a single-layer board structure is formed.

In an exemplary embodiment, the flexible printed circuit board further includes a connector 420 at an end of the second circuit region on a side away from the first circuit region. The connector 420 is disposed on a side of the first protective layer 12 away from the first substrate 10. The first protective layer 12 is provided with a connector opening exposing the first conductive layer 11. The connector 420 is disposed in the connector opening, so that a terminal of the connector 420 is connected to the first conductive layer 11.

In an exemplary embodiment, multiple drive signal lines 402 and multiple display signal lines 403 are located on the first conductive layer 11, and wiring optimization of display signal lines and touch signal lines is realized on a flexible printed circuit board with a single-layer structure, thus effectively avoiding interference between the display signal lines and the touch signal lines.

Figure 8:
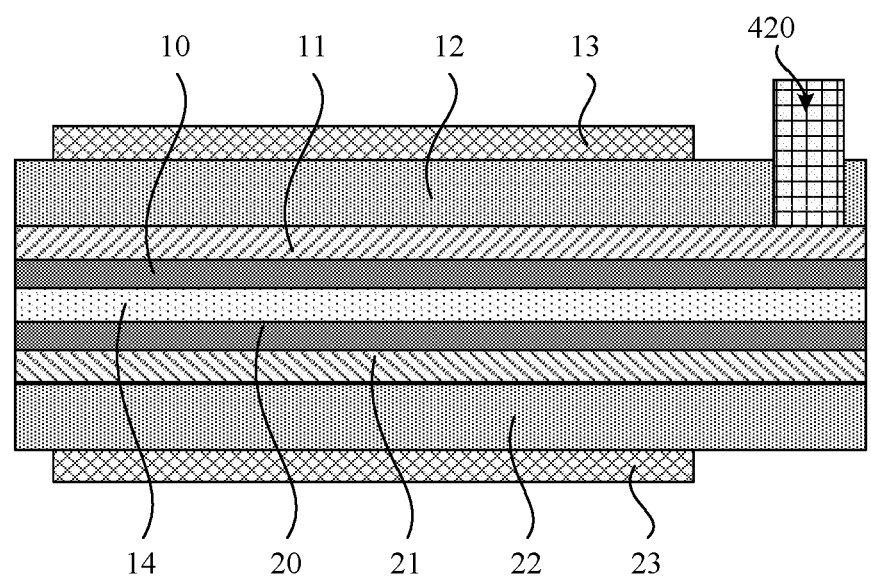
FIG. 8 is another schematic diagram of a film layer structure of a flexible printed circuit board according to an exemplary embodiment of the present disclosure.

FIG. 8 is another schematic diagram of a film layer structure of a flexible printed circuit board according to an exemplary embodiment of the present disclosure, which is a sectional view taken along the A-A direction in FIG. 6. As shown in FIG. 6 and FIG. 8, in a plane perpendicular to a plane of the flexible printed circuit board, a main structure of the flexible printed circuit board includes a first conductive layer 11 disposed on a first substrate 10; a first protective layer 12 disposed on a side of the first conductive layer 11 away from the first substrate 10; a first shielding layer 13 disposed on a side of the first protective layer 12 away from the first substrate 10; a first adhesive layer 14 disposed on a side of the first substrate 10 away from the first conductive layer 11; a second substrate 20 disposed on a side of the first adhesive layer 14 away from the first substrate 10; a second conductive layer 21 disposed on a side of the second substrate 20 away from the first substrate 10; a second protective layer 22 disposed on a side of the second conductive layer 21 away from the first substrate 10; and a second shielding layer 23 disposed on a side of the second protective layer 22 away from the first substrate 10, thus a double-layer board structure is formed.

In an exemplary embodiment, the flexible printed circuit board further includes a connector 420 at an end of the second circuit region on a side away from the first circuit region. The connector 420 is disposed on the side of the first protective layer 12 away from the first substrate 10. The first protective layer 12 is provided with a connector opening exposing the first conductive layer 11. The connector 420 is disposed in the connector opening, so that a terminal of the connector 420 is connected to the first conductive layer 11.

In an exemplary embodiment, multiple display signal lines 403 may be located on the first conductive layer 11, and multiple drive signal lines 402 may be located on the second conductive layer 21, so that wiring optimization of the display signal lines and touch signal lines may be realized on the flexible printed circuit board with the double-layer structure, and interference between display signal lines and the touch signal lines may be effectively avoided. In some possible embodiments, the multiple display signal lines 403 may be located on the second conductive layer, and the multiple drive signal lines may be located on the first conductive layer.

In a display touch apparatus, a display signal line connected to a display lead and a touch signal line connected to a touch lead are both disposed on a same flexible printed circuit board, the display signal line is introduced into a connector, and the touch signal line is introduced into a touch IC. The touch signal line includes a drive signal line and a sense signal line. The drive signal line and the sense signal line are introduced to the flexible printed circuit board from different sides. Since the touch IC is usually located on a side of the flexible printed circuit board and the connector is located on the other side of the flexible printed circuit board, the drive signal line or the sense signal line need to cross the display signal line before being introduced to the touch IC, as shown by a dotted line 402a in FIG. 5. In order to avoid mutual interference between the display signal line and the touch signal line, the flexible printed circuit board needs to adopt a multi-layer board (≥3 layers) structure, or adopt a two-layer board+bridge structure. The display signal line and the touch signal line are respectively disposed on different layers of the flexible printed circuit board, and a shielding layer is disposed between the display signal line and the touch signal line. A research shows that a scheme with a multi-layer board structure has some defects, such as high cost, increased thickness and reduced product yield. A scheme with a two-layer board+bridge structure has some defects, such as increased thickness at a position of the bridge and a complex binding process.

An exemplary embodiment of the present disclosure provides a display touch apparatus in which a display structure and a touch structure are integrated. By optimizing wiring of the display signal line and the touch signal line, interference between the display signal line and the touch signal line may be effectively avoided when a single-layer board structure or a two-layer board structure are adopted in the flexible printed circuit board. In the wiring scheme of the exemplary embodiment of the present disclosure, while the display signal line is introduced from the first circuit region to the second circuit region, one of the drive signal line and the sense signal line is synchronously introduced from the first circuit region to the second circuit region, and the signal line synchronously introduced to the second circuit region bypasses the display signal line and then returns to the first circuit region, so that the touch signal line avoids the display signal line and effectively avoids the touch signal line from crossing the display signal line, which not only effectively avoids mutual interference between the display signal line and the touch signal line, ensures working reliability and increases performance stability, but also realizes the flexible printed circuit board by adopting a single-layer board structure or a two-layer board structure. The use of a multi-layer board structure or a two-layer board+bridge structure is avoided, on one hand thickness space of the flexible printed circuit board is released, effectively reducing thickness of the flexible printed circuit board, which is conducive to the thinness of the display touch apparatus; on the other hand, the cost of the flexible printed circuit board is reduced, difficulties of the binding process, is simplified, risks of defects are reduced, and product yield is improved.

Figure 9:
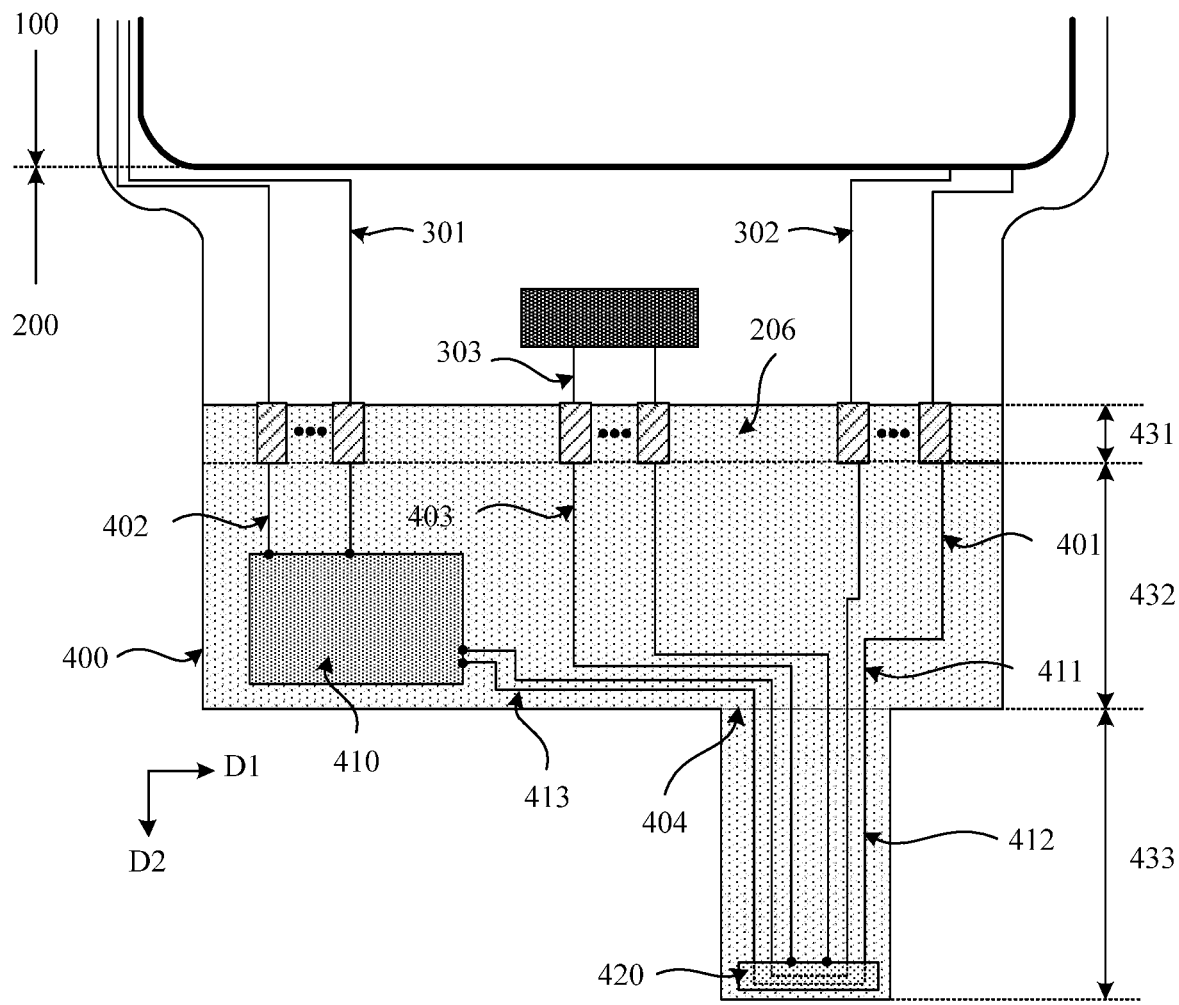
FIG. 9 is another schematic diagram of binding connection of a flexible printed circuit board according to an exemplary embodiment of the present disclosure.

FIG. 9 is another schematic diagram of binding connection of a flexible printed circuit board according to an exemplary embodiment of the present disclosure. As shown in FIG. 9, a structure of the binding region 200 may be similar to those in the previous exemplary embodiments. A flexible printed circuit board 400 may include a binding terminal region 431, a first circuit region 432 and a second circuit region 433. The first circuit region 432 may include a touch IC 410, wherein the touch IC 410 is located on a left side of the flexible printed circuit board 400, the second circuit region 433 may include a connector 420, and the second circuit region 433 is located on a right side of the flexible printed circuit board 400. The binding terminal region 431 may include a first terminal region, a middle terminal region and a second terminal region. Multiple terminals in the first terminal region are correspondingly connected to multiple pins in the first pin region. Multiple terminals in the middle terminal region are correspondingly connected to multiple pins in the middle region, and multiple terminals in the second terminal region are connected to multiple pins in the second pin region. A sense signal line 401 serves as a first signal line, a drive signal line 402 serves as a second signal line, a display signal line 403 serves as a third signal line, the touch IC 410 serves as a driver circuit, and the connector 420 serves as an external connector.

In an exemplary embodiment, multiple sense signal lines 401 are only disposed in the first circuit region 432. First ends of the multiple sense signal lines 401 are correspondingly connected to multiple terminals in the first terminal region, and are correspondingly connected to multiple sense leads 301 on a left side of the binding region through multiple terminals in the first terminal region and multiple pins in the first pin region. Second ends of the multiple sense signal lines 401 extend to the touch IC 410 and are connected to the touch IC 410 located in the first circuit region, thus realizing a connection between the touch IC 410 and the multiple sense leads 301, and making the touch IC 410 provide touch sense signals to the multiple sense leads 301.

In an exemplary embodiment, the sense signal lines 401 may be straight lines extending along the second direction D2, or may be fold lines. Since the first terminal region and the touch IC 410 are both located on a left side of the flexible printed circuit board 400, and the multiple sense signal lines 401 are also located on the left side of the flexible printed circuit board 400, it is realized that the multiple sense signal lines 401 and the multiple display signal lines 403 do not overlap in the first circuit region.

In an exemplary embodiment, the drive signal lines 402 are respectively disposed in the first circuit region 432 and the second circuit region 433. First ends of the multiple drive signal lines 402 are correspondingly connected to multiple terminals in the second terminal region, and are correspondingly connected to multiple drive leads 302 in the binding region through multiple terminals in the second terminal region and multiple pins in the second pin region. Second ends of the multiple drive signal lines 402 extend from the first circuit region 432 to the second circuit region 433, and then extend from the second circuit region 433 to the first circuit region 432 after bypassing the multiple display signal lines 403, are connected to the touch IC 410 located in the first circuit region, thus realizing a connection between the touch IC 410 and the multiple drive leads 302 in the binding region, and making the touch IC 410 provide touch sense signals to the multiple drive leads 302. Since the second terminal region and the second circuit region 433 are both located on a right side of the flexible printed circuit board 400, and the multiple drive signal lines 402 bypass the multiple display signal lines 403, it is realized that the multiple drive signal lines 402 and the multiple display signal lines 403 do not overlap in the first circuit region and the second circuit region.

In an exemplary embodiment, multiple display signal lines 403 are respectively disposed in the first circuit region 432 and the second circuit region 433. First ends of the multiple display signal lines 403 are correspondingly connected to multiple terminals in the middle terminal region, and are correspondingly connected to the multiple display leads 303 in the binding region through multiple terminals in the middle terminal region and multiple pins in the middle pin region. Second ends of the multiple display signal lines 403 extend from the first circuit region 432 to the second circuit region 433, and are connected to the connector 420 located in the second circuit region, thus realizing a connection between the connector 420 and the multiple display leads 303 in the binding region, so that an external control apparatus may provide display signals to the multiple display leads 303 through the connector 420.

In an exemplary embodiment, a drive signal line 402 may include a first connection line 411, a turning connection line 412, and a second connection line 413 which are connected in sequence.

In an exemplary embodiment, the first connection line 411 is located in the first circuit region 432, and a first end of the first connection line 411 serving as a first end of the drive signal line 402 is correspondingly connected to multiple terminals of the second terminal region. A second end of the first connection line 411 extends to a junction region 404 between the first circuit region and the second circuit region.

In an exemplary embodiment, the turning connection line 412 is located in the second circuit region 433, a first end of the turning connection line 412 is connected to the second end of the first connection line 411 located in the junction region 404, and a second end of the turning connection line 412 first extends towards the connector 420, then bypasses a terminal connected to the display signal line 403 in the connector 420 by using an on-board connection line, and then extends away from the connector 420 to the junction region 404 between the first circuit region and the second circuit region.

In an exemplary embodiment, the second connection line 413 is located in the first circuit region 432, and a first end of the second connection line 413 is connected to the second end of the turning connection line 412 located in the junction region 404. A second end of the second connection line 413, as a second end of the drive signal line 402, extends to the touch IC 410 and is connected to touch IC 410.

In an exemplary embodiment, there is no overlap region between an orthographic projection of the display signal line 403 on the substrate and an orthographic projection of the sense signal line 401 on the substrate. There is no overlap region between the orthographic projection of the display signal line 403 on the substrate and an orthographic projection of the drive signal line 402 on the substrate. There is no overlap region between the orthographic projection of the sensing signal line 401 on the substrate and the orthographic projection of the drive signal line 402 on the substrate.

Figure 10:
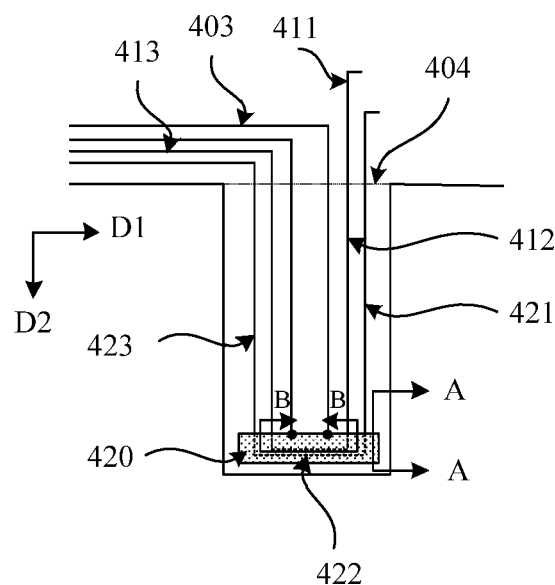
FIG. 10 is another schematic diagram of wiring of a turning connection line according to an exemplary embodiment of the present disclosure.

FIG. 10 is another schematic diagram of wiring of a turning connection line according to an exemplary embodiment of the present disclosure. As shown in FIG. 9 and FIG. 10, the turning connection line 412 located in the second circuit region is configured to form wiring that bypasses a terminal in the connector 420 in the second circuit region 433 through an in-board connection line, so that the drive signal line 402 may avoid crossing the display signal line 403, that is, there is no overlap region between an orthographic projection of the drive signal line 402 on the substrate and an orthographic projection of the display signal line 403 on the substrate.

In an exemplary embodiment, the second circuit region 433 may be rectangular and disposed at a side of the first circuit region 432 away from the binding terminal region 431. The connector 420 may be rectangular and disposed at an end of the second circuit region 433 away from the first circuit region 432. Multiple third signal lines 403 are located in a middle region of the second circuit region 433 along the first direction D1, and extend to the connector 420 along the second direction D2 and are connected to the connector 420. In an exemplary embodiment, the multiple third signal lines 403 may be straight lines or fold lines.

In an exemplary embodiment, the second circuit region 433 has a first region, a second region and a third region. The first region may be located at a side of the third signal line 403 away from the touch IC 410 in the first direction D1, the second region may be located at a side of the third signal line 403 close to the touch IC 410 in the first direction D1, and the third region may be located at a side of the second circuit region 433 away from the first circuit region 432. In an exemplary embodiment, the third region may be located in a region where the connector 420 is located.

In an exemplary embodiment, the turning connection line 412 includes a first sub-line 421, a turning sub-line 422 and a second sub-line 423 which are connected in sequence. The first sub-line 421 and the second sub-line 423 may be used as on-board connection lines, and the turning sub-line 422 may be used as an in-board connection line. The first sub-line 421 is located in the first region of the second circuit region 433 and on a first film layer. A first end of the first sub-line 421 serves as a first end of the turning connection line 412, and is connected to a second end of the first connection line 411 located in a junction region 404. A second end of the first sub-line 421 extends along the second direction D2 and extends to the third region of the second circuit region 433. The turning sub-line 422 is located in the third region of the second circuit region 433 and on a second film layer, wherein the second film layer is different from the first film layer. A first end of the turning sub-line 422 is connected to the second end of the first sub-line 421 through a connection column, and a second end of the turning sub-line 422 extends in an opposite direction of the first direction D1 and bypasses multiple terminals connected to the display signal line 403 in the connector 420. The second sub-line 423 is located in the second region of the second circuit region 433 and on the first film layer. A first end of the second sub-line 423 is connected to the second end of the turning sub-line 422. A second end of the second sub-line 423 extends to the junction region 404 along an opposite direction of the second direction D2. The second end of the second sub-line 423 serves as a second end of the turning connection line 412 and is connected to a first end of the second connection line 413 located in the junction region 404. Since the first sub-line 421 is located on a right side of the third signal line 403, the turning sub-line 422 bypasses the multiple terminals connected to the display signal line 403 in the connector 420, and the second sub-line 423 is located on a left side of the third signal line 403, there is no overlap region between an orthographic projection of the turning connection line 412 on the substrate and an orthographic projection of the display signal line 403 on the substrate, thus enabling the turning connection line 412 to bypass the display signal line 403.

In an exemplary embodiment, since the turning sub-line 422 is located in a different film layer from the first sub-line 421 and the second sub-line 423, the turning sub-line 422 forms an in-board connection line, and the turning sub-line 422 does not need to completely bypass the connector 420. Even if there is an overlap region between an orthographic projection of the turning sub-line 422 on the substrate and an orthographic projection of the connector 420 on the substrate, it may be realized that the turning connection line 412 bypasses the display signal line 403.

Figure 11:
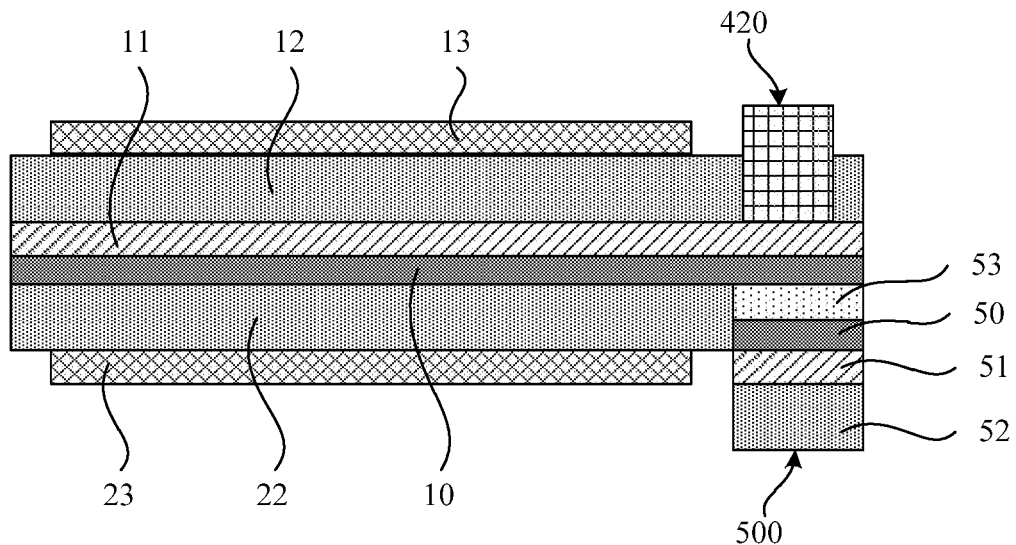
FIG. 11 is another schematic diagram of a film layer structure of a flexible printed circuit board according to an exemplary embodiment of the present disclosure.

FIG. 11 is another schematic diagram of a film layer structure of a flexible printed circuit board according to an exemplary embodiment of the present disclosure, which is a sectional view taken along an A-A direction in FIG. 10. As shown in FIG. 10 and FIG. 11, in a plane perpendicular to a plane of the flexible printed circuit board, a main structure of the flexible printed circuit board includes a first conductive layer 11 disposed on a first substrate 10; a first protective layer 12 disposed on a side of the first conductive layer 11 away from the first substrate 10; a first shielding layer 13 disposed on a side of the first protective layer 12 away from the first substrate 10; a second protective layer 22 disposed on a side of the first substrate 10 away from the first conductive layer 11; and a second shielding layer 23 disposed on a side of the second protective layer 22 away from the first substrate 10, thus a single-layer board structure is formed.

In an exemplary embodiment, the flexible printed circuit board further includes a connector 420 and a reinforcing structure 500 at an end of the second circuit region on a side away from the first circuit region.

In an exemplary embodiment, the connector 420 is disposed on a side of the first protective layer 12 away from the first substrate 10. The first protective layer 12 is provided with a connector opening exposing the first conductive layer 11. The connector 420 is disposed in the connector opening, so that a terminal of the connector 420 is connected to the first conductive layer 11.

In an exemplary embodiment, the reinforcing structure 500 is disposed on the side of the second protective layer 22 away from the first substrate 10. the second protective layer 22 is provided with a reinforcing structure opening exposing a surface of the first substrate 10 away from the first conductive layer 11. The reinforcing structure 500 is disposed on the first substrate 10 in the reinforcing structure opening. In an exemplary embodiment, the reinforcing structure 500 may include a reinforcing adhesive layer 53 disposed on the side of the first substrate 10 away from the first conductive layer 11; a reinforcing substrate 50 disposed on a side of the reinforcing adhesive layer 53 away from the first substrate 10; a reinforcing conductive layer 51 disposed on a side of the reinforcing substrate 50 away from the first substrate 10, and a reinforcing protective layer 52 disposed on a side of the reinforcing conductive layer 51 away from the first substrate 10. In this way, in a flexible printed circuit board with a single-layer board structure, a local two-layer board structure is formed by the reinforcing structure 500 disposed in the region where the connector 420 is located.

Figure 12:
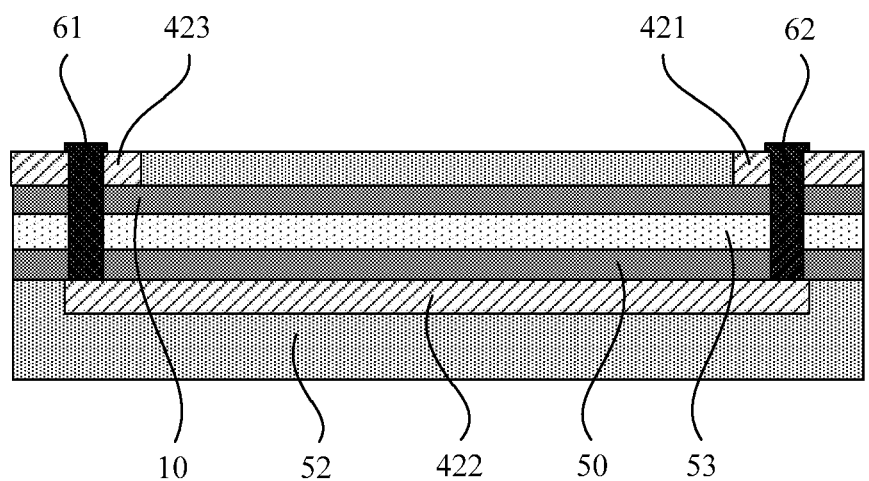
FIG. 12 is a schematic diagram of a structure of an in-board connection line according to an exemplary embodiment of the present disclosure.

In an exemplary embodiment, the reinforcing structure 500 may be used to form an in-board connection line of the turning connection line, i.e., the turning sub-line 422. FIG. 12 is a schematic diagram of a structure of an in-board connection line according to an exemplary embodiment of the disclosure, which is a sectional view taken along an B-B direction in FIG. 10. As shown in FIG. 10 and FIG. 12, the first sub-line 421 and the second sub-line 423 are both located in the first conductive layer 11, the display signal line 403 may be located in the first conductive layer 11, and the turning sub-line 422 is located in the reinforcing conductive layer 51. A first end of the turning sub-line 422 is connected to the second sub-line 423 through a first connection column 61, and a second end of the turning sub-line 422 is connected to the first sub-line 421 through a second connection column 62, so that the first sub-line 421 and the second sub-line 423 are connected through the first connection column 61, the turning sub-line 422 and the second connection column 62.

In an exemplary embodiment, a first via hole and a second via hole may be formed in the regions where the first sub-line 421 and the second sub-line 423 are located by etching. The first sub-line 421, the first substrate 10, the reinforcing adhesive layer 53 and the reinforcing substrate 50 in the first via hole are etched away to expose a surface of a first end of the turning sub-line 422, and the second sub-line 423, the first substrate 10, the reinforcing adhesive layer 53 and the reinforcing substrate 50 in the second via hole are etched away to expose a surface of a second end of the turning sub-line 422. Then, the first connection column 61 and the second connection column 62 are respectively formed in the first via hole and the second via hole by electroforming. Lower ends of the first connection column 61 and the second connection column 62 are connected to the turning sub-line 422, an upper end of the first connection column 61 is connected to the second sub-line 423, and an upper end of the second connection column 62 is connected to the first sub-line 421 to form an in-board connection line. In an exemplary embodiment, the first connection column 61 and the second connection column 62 may be formed by deposition or in other ways, which is not limited in the present disclosure.

An exemplary embodiment of the present disclosure provides a display touch apparatus in which a display structure and a touch structure are integrated. By optimizing wiring of the display signal line and the touch signal line, interference between the display signal line and the touch signal line may be effectively avoided when adopting a single-layer board+local two-layer board structure in the flexible printed circuit board. In a wiring scheme of the exemplary embodiment of the present disclosure, while the display signal line is introduced from the first circuit region to the second circuit region, one of the drive signal line and the sense signal line is synchronously introduced from the first circuit region to the second circuit region, and the signal line synchronously introduced to the second circuit region bypasses the display signal line and then returns to the first circuit region through an in-board connection line in the local two-layer board structure, so that the touch signal line avoids the display signal line and effectively avoids the touch signal line from crossing the display signal line, which not only effectively avoids mutual interference between the display signal line and the touch signal line, ensures working reliability and increases performance stability, but also realizes the flexible printed circuit board by adopting the single-layer board+local two-layer board structure. The use of a multi-layer board structure or a two-layer board+bridge structure is avoided, on one hand thickness space of the flexible printed circuit board is released, effectively reducing thickness of the flexible printed circuit board, which is conducive to the thinness of the display touch apparatus; on the other hand, the cost of the flexible printed circuit board is reduced, the difficulty of the binding process is simplified, risks of defects are reduced, and product yield is improved. In addition, the flexible printed circuit board adopts a single-layer board+local two-layer board structure, which may not only realize an in-board connection line bypassing the display signal line, but also realize a structural reinforcement of the region where the connector is located, thus improving a working reliability and a service life of the flexible printed circuit board.

Figure 13:
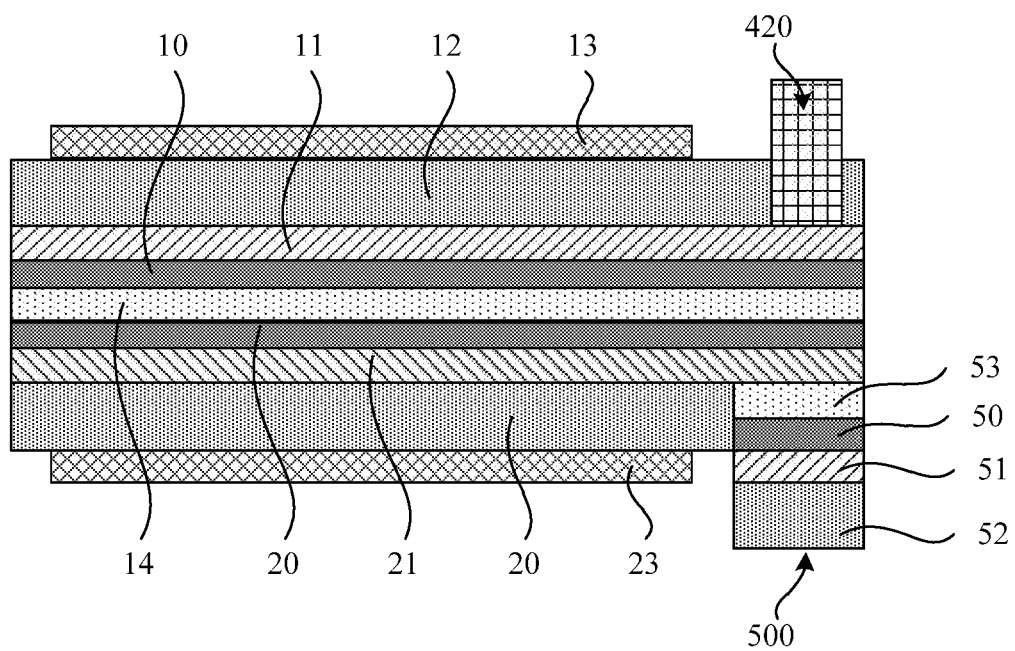
FIG. 13 is another schematic diagram of a film layer structure of a flexible printed circuit board according to an exemplary embodiment of the present disclosure.

FIG. 13 is another schematic diagram of a film layer structure of a flexible printed circuit board according to an exemplary embodiment of the present disclosure, which is a sectional view taken along the A-A direction in FIG. 10. As shown in FIG. 10 and FIG. 13, in a plane perpendicular to a plane of the flexible printed circuit board, a main structure of the flexible printed circuit board includes a first conductive layer 11 disposed on a first substrate 10; a first protective layer 12 disposed on a side of the first conductive layer 11 away from the first substrate 10; a first shielding layer 13 disposed on a side of the first protective layer 12 away from the first substrate 10; a first adhesive layer 14 disposed on a side of the first substrate 10 away from the first conductive layer 11; a second substrate 20 disposed on a side of the first adhesive layer 14 away from the first substrate 10; a second conductive layer 21 disposed on a side of the second substrate 20 away from the first substrate 10; a second protective layer 22 disposed on a side of the second conductive layer 21 away from the first substrate 10; and a second shielding layer 23 disposed on a side of the second protective layer 22 away from the first substrate 10, thus a double-layer board structure is formed.

In an exemplary embodiment, the flexible printed circuit board further includes a connector 420 and a reinforcing structure 500 at an end of the second circuit region on a side away from the first circuit region. In an exemplary embodiment, the connector 420 is disposed on the side of the first protective layer 12 away from the first substrate 10. The first protective layer 12 is provided with a connector opening exposing the first conductive layer 11. The connector 420 is disposed in the connector opening, so that a terminal of the connector 420 is connected to the first conductive layer 11.

In an exemplary embodiment, the reinforcing structure 500 is disposed on the side of the second protective layer 22 away from the first substrate 10. The second protective layer 22 is provided with a reinforcing structure opening exposing a surface of the second conductive layer 21 away from the first substrate 10. The reinforcing structure 500 is disposed on the second conductive layer 21 in the reinforcing structure opening. In an exemplary embodiment, the reinforcing structure 500 may include a reinforcing adhesive layer 53 disposed on the side of the second conductive layer 21 away from the first substrate 10; a reinforcing substrate 50 disposed on a side of the reinforcing adhesive layer 53 away from the first substrate 10; a reinforcing conductive layer 51 disposed on a side of the reinforcing substrate 50 away from the first substrate 10, and a reinforcing protective layer 52 disposed on a side of the reinforcing conductive layer 51 away from the first substrate 10. In this way, in a flexible printed circuit board with a single-layer board structure, a local two-layer board structure is formed by the reinforcing structure 500 disposed in the region where the connector 420 is located.

In an exemplary embodiment, the reinforcing structure 500 may be used to form an in-board connection line of the turning connection line, i.e., the turning sub-line 422. For example, the display signal line is located on the first conductive layer 11, and multiple display signal lines are correspondingly connected to multiple terminals of the connector 420. The first sub-line 421 and the second sub-line 423 in the turning connection line 412 are located in the second conductive layer 21, and the turning sub-line 422 in the turning connection line 412 is located in the reinforcing conductive layer 51. The turning sub-line 422 bypasses multiple terminals connected to the display signal line 403 in the connector 420, and two ends of the turning sub-line 422 are connected to the first sub-line 421 and the second sub-line 423 through connection columns respectively, so that the first sub-line 421 and the second sub-line 423 are connected through the connection columns and the turning sub-line. In this way, in regions outside the connector, the drive signal line is located in the first conductive layer or the second conductive layer. After the drive signal line is introduced to the region where the connector is located, the drive signal line 402 is introduced to the reinforcing conductive layer on a back of the connector. After the drive signal line bypasses other wirings and corresponding terminals, it returns from the reinforcing conductive layer to the first conductive layer or the second conductive layer, and finally is introduced to the touch IC. For another example, the first sub-line 421 and the second sub-line 423 may be located in the first conductive layer 11, multiple display signal lines may be located in the second conductive layer 21, and the turning sub-line 422 may be located in the reinforcing conductive layer 51.

The structures shown in the present disclosure are only exemplary descriptions, and the structure of the turning sub-lines may be altered according to actual needs, which is not limited hereto in the present disclosure. For example, a second conductive layer may be used to form an in-board connection line of the turning connection line, that is, the turning sub-line. For the double-layer board structure shown in FIG. 8, the display signal line and the sense signal line may be disposed on the first conductive layer, a first connection line, a second connection line and part of a turning connection line in the drive signal line may be disposed on the first conductive layer, and a turning sub-line in the turning connection line may be located on the second conductive layer. For another example, the turning sub-line may be located in the connector, and the turning sub-line is formed at a periphery of multiple connection terminals in the connector, and two ends of the turning sub-line are connected to the first sub-line and the second sub-line respectively.

An exemplary embodiment of the present disclosure provides a display touch apparatus in which a display structure and a touch structure are integrated. By optimizing wiring of the display signal line and the touch signal line, interference between the display signal line and the touch signal line may be effectively avoided when adopting a double-layer board+local three-layer board structure in the flexible printed circuit board. In a wiring scheme of the exemplary embodiment of the present disclosure, while the display signal line is introduced from the first circuit region to the second circuit region, one of the drive signal line and the sense signal line is synchronously introduced from the first circuit region to the second circuit region, and the signal line synchronously introduced to the second circuit region bypasses the display signal line and then returns to the first circuit region through an in-board connection line in the local three-layer board structure, so that the touch signal line avoids the display signal line and effectively avoids the touch signal line from crossing the display signal line, which not only effectively avoids mutual interference between the display signal line and the touch signal line, ensures working reliability and increases performance stability, but also realizes the flexible printed circuit board by adopting a double-layer board+local three-layer board structure. The use of a multi-layer board structure or a two-layer board+bridge structure is avoided, on one hand thickness space of the flexible printed circuit board is released, effectively reducing thickness of the flexible printed circuit board, which is conducive to the thinness of the display touch apparatus. On the other hand, the cost of the flexible printed circuit board is reduced, difficulty of the binding process is simplified, risks of defects are reduced, and product yield is improved. In addition, the flexible printed circuit board adopts a double-layer board+local three-layer board structure, which may not only realize an in-board connection line bypassing the display signal line, but also realize a structural reinforcement of the region where the connector is located, thus improving the working reliability and the service life of the flexible printed circuit board.

The drawings of the present application are only related to the structures involved in the present disclosure, and typical designs may be referred to for other structures. The embodiments of the present disclosure, i.e., features in the embodiments may be combined with each other to obtain new embodiments if there is conflict.

Those of ordinary skills in the art will understand that modifications or equivalent substitutions may be made to the technical solutions of the present disclosure without departing from the essence and scope of the technical solutions of the present application, and shall be covered within the scope of the claims of the present application.

What is claimed is:

1. A flexible printed circuit board, comprising: a binding terminal region; a first circuit region located at a side of the binding terminal region; and a second circuit region located at a side of the first circuit region away from the binding terminal region, wherein:
the binding terminal region comprises a plurality of terminals, the first circuit region comprises a driver circuit, a plurality of first signal lines, a plurality of second signal lines, and a plurality of third signal lines, and the second circuit region comprises an external connector; first ends of the plurality of first signal lines, the plurality of second signal lines and the plurality of third signal lines are correspondingly connected to the terminals of the binding terminal region; second ends of the plurality of first signal lines and the plurality of second signal lines are respectively connected to the driver circuit; and second ends of the plurality of third signal lines are connected to the external connector; and there is no overlap region between an orthographic projection of the plurality of first signal lines and the plurality of second signal lines on a plane of the flexible printed circuit board and an orthographic projection of the plurality of third signal lines on the plane of the flexible printed circuit board; and the plurality of terminals in the binding terminal region are disposed along a first direction, and the binding terminal region comprises a first terminal region, a middle terminal region and a second terminal region which are disposed in sequence along the first direction; a plurality of terminals in the first terminal region are correspondingly connected to the first ends of the plurality of first signal lines; a plurality of terminals in the second terminal region are correspondingly connected to the first ends of the plurality of second signal lines; a plurality of terminals in the middle terminal region are correspondingly connected to the first ends of the plurality of third signal lines.

2. The flexible printed circuit board according to claim 1, wherein along the first direction, the driver circuit is located on a side close to the first terminal region, the plurality of first signal lines are located in the first circuit region, and second ends of the plurality of first signal lines are connected to the driver circuit.

3. The flexible printed circuit board according to claim 2, wherein along the first direction the second circuit region is located on a side away from the first terminal region; second ends of the plurality of third signal lines extend from the first circuit region to the second circuit region and are connected to the external connector; second ends of the plurality of second signal lines extend from the first circuit region to the second circuit region, bypass the third signal lines, extend from the second circuit region to the first circuit region, and are connected to the driver circuit.

4. The flexible printed circuit board according to claim 3, wherein a second signal line comprises a first connection line, a turning connection line and a second connection line which are connected in sequence; the first connection line is located in the first circuit region, a first end of the first connection line is connected to a terminal of the second terminal region, and a second end of the first connection line extends to a junction region between the first circuit region and the second circuit region; the turning connection line is located in the second circuit region, a first end of the turning connection line is connected to the second end of the first connection line, and a second end of the turning connection line extends to the junction region between the first circuit region and the second circuit region after bypassing the third signal lines; the second connection line is located in the first circuit region, a first end of the second connection line is connected to the second end of the turning connection line, and the second end of the turning connection line is connected to the driver circuit.

5. The flexible printed circuit board according to claim 4, wherein the turning connection line comprises a first sub-line, a turning sub-line and a second sub-line which are connected in sequence; the first sub-line is located on a side of the third signal lines away from the driver circuit, and a first end of the first sub-line is connected to the second end of the first connection line located in the junction region, and a second end of the first sub-line extends towards the external connector and is connected to a first end of the turning sub-line; the second sub-line is located on a side of the third signal lines close to the driver circuit; a first end of the second sub-line is connected to the second end of the turning sub-line, and a second end of the second sub-line extends towards the junction region and is connected to the first end of the second connection line located in the junction region; the turning sub-line is located on a side of the external connector away from the first circuit region, and the turning sub-line bypasses the external connector or a terminal in the external connector connected to the third signal line.

6. The flexible printed circuit board according to claim 5, wherein in a plane perpendicular to the plane of the flexible printed circuit board, the flexible printed circuit board comprises: a first conductive layer disposed on a first substrate, a first protective layer disposed on a side of the first conductive layer away from the first substrate, and a second protective layer disposed on a side of the first substrate away from the first conductive layer; wherein the first sub-line, the turning sub-line and the second sub-line are all located on the first conductive layer.

7. The flexible printed circuit board according to claim 6, wherein the external connector comprises a connector; at an end of the second circuit region away from the first circuit region, the first protective layer is provided with a connector opening, and the connector is disposed in the connector opening.

8. The flexible printed circuit board according to claim 5, wherein in a plane perpendicular to the plane of the flexible printed circuit board, the flexible printed circuit board comprises a first conductive layer disposed on a first substrate, a first protective layer disposed on a side of the first conductive layer away from the first substrate, a first adhesive layer disposed on a side of the first substrate away from the first conductive layer, a second substrate disposed on a side of the first adhesive layer away from the first substrate, a second conductive layer disposed on a side of the second substrate away from the first substrate and a second protective layer disposed on a side of the second conductive layer away from the first substrate; wherein the first sub-line, the turning sub-line and the second sub-line are all located on the first conductive layer, or the first sub-line, the turning sub-line and the second sub-line are all located on the second conductive layer.

9. The flexible printed circuit board according to claim 8, wherein the external connector comprises a connector; at an end of the second circuit region away from the first circuit region, the first protective layer is provided with a connector opening, and the connector is disposed in the connector opening.

10. The flexible printed circuit board according to claim 5, wherein in a plane perpendicular to the plane of the flexible printed circuit board, the flexible printed circuit board comprises: a first conductive layer disposed on a first substrate, a first protective layer disposed on a side of the first conductive layer away from the first substrate, and a second protective layer disposed on a side of the first substrate away from the first conductive layer; at an end of the second circuit region away from the first circuit region, the second protective layer is provided with a reinforcing structure opening which is provided with a reinforcing structure; wherein the reinforcing structure comprises: a reinforcing adhesive layer disposed on the side of the first substrate away from the first conductive layer, a reinforcing substrate disposed on a side of the reinforcing adhesive layer away from the first substrate, a reinforcing conductive layer disposed on a side of the reinforcing substrate away from the first substrate, and a reinforcing protective layer disposed on a side of the reinforcing conductive layer away from the first substrate; the first sub-line and the second sub-line are both located on the first conductive layer, the turning sub-line is located on the reinforcing conductive layer, and the turning sub-line is respectively connected to the first sub-line and the second sub-line through connection columns.

11. The flexible printed circuit board according to claim 10, wherein the external connector comprises a connector; at an end of the second circuit region away from the first circuit region, the first protective layer is provided with a connector opening, and the connector is disposed in the connector opening.

12. The flexible printed circuit board according to claim 5, wherein in a plane perpendicular to the plane of the flexible printed circuit board, the flexible printed circuit board comprises a first conductive layer disposed on a first substrate, a first protective layer disposed on a side of the first conductive layer away from the first substrate, a first adhesive layer disposed on a side of the first substrate away from the first conductive layer, a second substrate disposed on a side of the first adhesive layer away from the first substrate, a second conductive layer disposed on a side of the second substrate away from the first substrate and a second protective layer disposed on a side of the second conductive layer away from the first substrate; at an end of the second circuit region away from the first circuit region, the second protective layer is provided with a reinforcing structure opening which is provided therein with a reinforcing structure; the reinforcing structure comprises: a reinforcing adhesive layer disposed on a side of the second conductive layer away from the second substrate, a reinforcing substrate disposed on a side of the reinforcing adhesive layer away from the second substrate, and a reinforcing conductive layer disposed on a side of the reinforcing substrate away from the second substrate, and a reinforcing protective layer disposed on a side of the reinforcing conductive layer away from the second substrate; the first sub-line and the second sub-line are both located on the first conductive layer, the turning sub-line is located on the reinforcing conductive layer, and the turning sub-line is respectively connected to the first sub-line and the second sub-line through connection columns; or, the first sub-line and the second sub-line are both located on the second conductive layer, the turning sub-line is located on the reinforcing conductive layer, and the turning sub-line is respectively connected to the first conductive layer and the second conductive layer through connection columns.

13. The flexible printed circuit board according to claim 12, wherein the external connector comprises a connector; at an end of the second circuit region away from the first circuit region, the first protective layer is provided with a connector opening, and the connector is disposed in the connector opening.

14. A display touch apparatus comprising a touch display panel and the flexible printed circuit board according to claim 1, wherein the touch display panel comprises an effective region and a binding region located at a side of the effective region, the binding region comprises a binding pin region which comprises a plurality of pins, and a plurality of terminals of the binding terminal region in the flexible printed circuit board are correspondingly connected to the plurality of pins of the binding pin region.

15. The display touch apparatus of claim 14, wherein the plurality of pins of the binding pin region are disposed along a first direction, and the binding pin region comprises a first pin region, a middle pin region and a second pin region which are disposed in sequence along the first direction; a plurality of terminals in the first terminal region are correspondingly connected to a plurality of pins in the first pin region, a plurality of terminals in the second terminal region are correspondingly connected to a plurality of pins of the second pin region, and a plurality of terminals in the middle terminal region are correspondingly connected to a plurality of pins in the middle pin region.

16. The display touch apparatus of claim 15, wherein the binding region further comprises a plurality of sense leads, a plurality of drive leads and a plurality of display leads, wherein the plurality of sense leads are correspondingly connected to a plurality of pins in the first pin region, the plurality of drive leads are correspondingly connected to a plurality of pins in the second pin region, and the plurality of display leads are correspondingly connected to a plurality of pins in the middle pin region.

17. The display touch apparatus of claim 16, wherein the driver circuit comprises a touch driver integrated circuit and the connector comprises a board-to-board connector.

18. The display touch apparatus of claim 15, wherein the driver circuit comprises a touch driver integrated circuit and the connector comprises a board-to-board connector.

19. The display touch apparatus of claim 14, wherein the driver circuit comprises a touch driver integrated circuit and the connector comprises a board-to-board connector.

* * * * *